United States Patent
Hotta et al.

(10) Patent No.: US 6,939,649 B2
(45) Date of Patent: Sep. 6, 2005

(54) FABRICATION METHOD OF SEMICONDUCTOR INTEGRATED CIRCUIT DEVICE AND MASK

(75) Inventors: Shoji Hotta, Ome (JP); Norio Hasegawa, Hinode (JP); Toshihiko Tanaka, Tokyo (JP)

(73) Assignee: Renesas Technology Corp., Tokyo (JP)

(*) Notice: Subject to any disclaimer, the term of this patent is extended or adjusted under 35 U.S.C. 154(b) by 310 days.

(21) Appl. No.: 10/259,397

(22) Filed: Sep. 30, 2002

(65) Prior Publication Data

US 2003/0073038 A1 Apr. 17, 2003

(30) Foreign Application Priority Data

Oct. 12, 2001 (JP) .................................. 2001-314812

(51) Int. Cl.[7] .............................. G03F 9/00; G03C 5/00
(52) U.S. Cl. ........................................ 430/5; 430/311
(58) Field of Search .................................. 430/5, 311

(56) References Cited

U.S. PATENT DOCUMENTS

| | | |
|---|---|---|
| 4,684,971 A | 8/1987 | Payne |
| 5,376,483 A | 12/1994 | Rolfson |
| 5,378,585 A | 1/1995 | Watanabe |
| 5,389,474 A | 2/1995 | Iguchi et al. |
| 5,418,092 A | 5/1995 | Okamoto |
| 5,556,724 A | 9/1996 | Tarumoto et al. |
| 5,741,613 A | 4/1998 | Moon et al. |
| 5,948,572 A | 9/1999 | Liu et al. |
| 5,989,760 A | 11/1999 | Mangat et al. |
| 6,576,377 B2 * | 6/2003 | Kikuchi .................... 430/5 |

FOREIGN PATENT DOCUMENTS

| | | |
|---|---|---|
| JP | 5630129 | 3/1981 |
| JP | 5922050 | 2/1984 |
| JP | 5-289307 | 11/1993 |
| JP | 10-326009 | 12/1998 |
| JP | 11-65083 | 3/1999 |
| JP | 11-125894 | 5/1999 |

* cited by examiner

*Primary Examiner*—Geraldine Letscher
(74) *Attorney, Agent, or Firm*—Antonelli, Terry, Stout & Kraus, LLP

(57) ABSTRACT

A method of fabrication of a semiconductor integrated circuit device uses a mark having, on a first main surface of a mask substrate, a first light transmitting region, a second light transmitting region disposed at the periphery of the first light transmitting region and permitting inversion of the phase of light transmitted through the second light transmitting region relative to light transmitted through the first light transmitting region, and a light shielding region disposed at the periphery of the second light transmitting region. The second light transmitting region is formed from a first film deposited over the first main surface of the mask substrate, said light shielding region is formed by a second film deposited over the first main surface of the mask substrate via said first film, and at least one of said first film and second is formed from a resist film.

48 Claims, 17 Drawing Sheets

FABRICATION METHOD OF SEMICONDUCTOR INTEGRATED CIRCUIT DEVICE AND MASK

BACKGROUND OF THE INVENTION

The present invention relates to a method of fabrication of a semiconductor integrated circuit device and to a mask making technique; and, more particularly, the invention relates to a technique that is effective when applied to an exposure process using a phase shift mask.

An edge-enhanced phase shift mask is one type of phase shift mask. It has, on the main surface of a mask substrate that is transparent relative to an exposure light, a light shielding film made of metal, such as chromium, a light transmitting region formed by an opening in a portion of the light shielding film, and a transparent phase shifter, at the periphery of the light transmitting region (at the edge portion in the vicinity of the boundary with the light shielding film), for inverting the phase of light transmitted through the light transmitting region by 180°. In the edge-enhanced phase shift mask, by optimizing the edge width according to the transmittance of the edge portion, it is possible to attain an almost similar level of resolving performance improving effect at any transmittance.

With regards to the edge-enhanced phase shift mask, Japanese Unexamined Patent Publication No. Hei 11(1999)-65083, for example, discloses a technique for transferring hole patterns onto a semiconductor wafer by using a photomask which has mask hole patterns having a maximum transmittance, medium transmittance patterns at the periphery thereof, causing light which has transmitted through the mask hole patterns to have a phase difference of 180°±60°, and patterns formed at the periphery of the medium transmittance patterns and having a minimum transmittance.

Japanese Unexamined Patent Publication No. Hei 11(1999)125894, discloses a technique for transferring patterns of a desired size onto a semiconductor wafer by using a photomask having some transparent regions whose mask patterns are made larger than a predetermined size, a semitransparent region disposed at the periphery of each of the transparent regions, having a predetermined width and forming a reverse phase relative to light transmitted through the transparent region, and a light shielding region disposed at the periphery of the semitransparent region.

Japanese Unexamined Patent Publication No. Hei 10(1998)326009, discloses a pattern transferring technique through use of a phase shift mask which has phase shift patterns, at the periphery of each of a plurality of main light transmitting regions, having a lower transmittance than that of the main light transmitting regions, wherein the width of some phase shift patterns which particularly require edge enhancement, among these phase shift patterns, is made greater than that of the other ones.

SUMMARY OF THE INVENTION

The present inventor has found that the above-described edge-enhanced phase shift mask techniques have the following problems.

A phase shift mask needs much time for preparation compared with a normal photo mask, because formation of a phase shift prolongs its manufacturing step, which leads to the problem that development or fabrication of a semiconductor device using this mask takes much time.

An object of the present invention is to provide a technique which can shorten the manufacturing time of an edge-enhanced phase shift mask.

Another object of the present invention is to provide a technique to shorten the fabrication time of a semiconductor integrated circuit device using an edge-enhanced phase shift mask.

The above-described objects, other objects and novel features of the present invention will be apparent from the following description herein and the accompanying drawings.

Outlines of representative aspects of the invention, among the features disclosed by the present application, will be described briefly.

In one aspect of the present invention, there is provided an edge enhanced phase shift mask having a light shielding body, or both a light shielding body and a phase shifter, made of a resist film.

In another aspect of the present invention, there is provided a process having an exposure step for transferring a predetermined pattern to a photosensitive resin film on a wafer by using an edge enhanced phase shift mask having a light shielding body, or both a light shielding body and a phase shifter, made of a resist film.

DETAILED DESCRIPTION OF THE PREFERRED EMBODIMENTS

Figure 1:
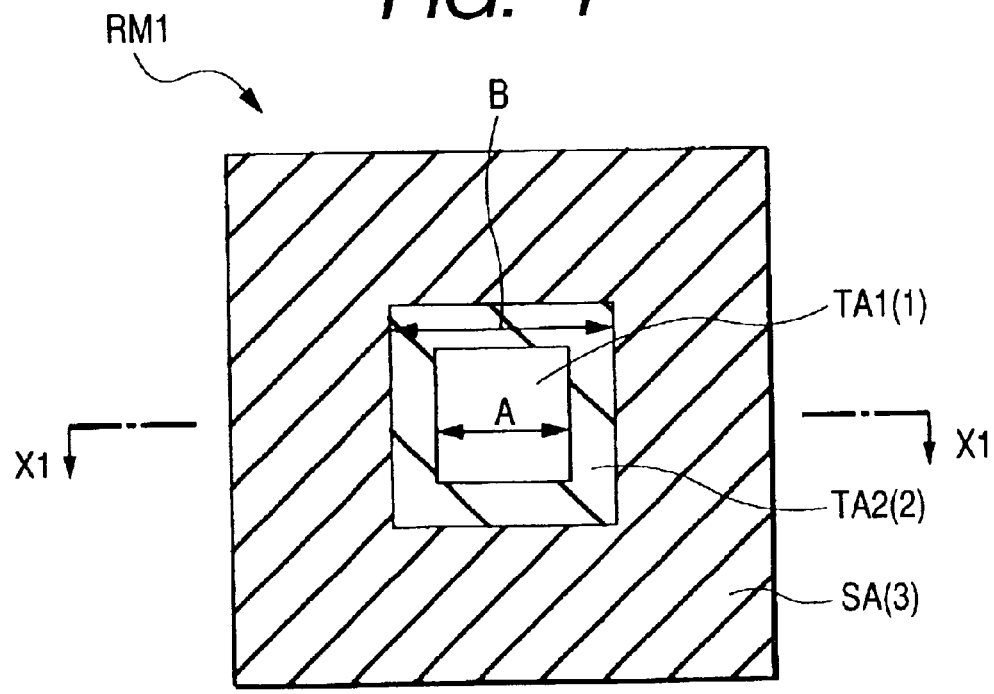
FIG. 1 is a fragmentary plan view of a phase shift mask to be used in the fabrication of a semiconductor integrated circuit device according to Embodiment 1.

Prior to description of the invention, with reference to various embodiments of the present invention, the meanings of the terms used herein will be explained.

1. The term "device surface" means the main surface of a wafer on which device patterns corresponding to a plurality of chip regions are to be formed by photolithography.

2. The term "wafer" means a silicon single crystal substrate (semiconductor wafer or a semiconductor integrated circuit wafer, of substantially flat circular shape), a sapphire substrate, a glass substrate or another insulating, non-insulating or semiconductor substrate, or a composite substrate thereof, each used for the fabrication of a semiconductor integrated circuit device.

3. Mask: a generic name for substrates on which patterns of a final size have been drawn. It embraces a "reticle" for forming patterns several times as large as those of the final size. It is used when exposure equipment using a visible light, ultraviolet light or the like is used. The term mask embraces a normal mask, resist mask and phase shift mask.

4. Normal mask (metal mask or chromium mask): an ordinarily used mask having, on a transparent mask substrate, mask patterns formed of light shielding patterns made of a metal and light transmitting patterns.

5. Resist mask: The term "resist mask" as used herein means a mask that is obtained by exposing a film composed mainly of a photosensitive resist to energy beam lithography or photo lithography using an electron beam (ion beam) or light (ultraviolet light such as vacuum ultraviolet light, far ultraviolet light or near ultraviolet light, or visible light), thereby producing patterning on a mask substrate. As a light shielding film, it blocks all or part of ultraviolet rays, such as vacuum ultraviolet rays, far ultraviolet rays and near ultraviolet rays, and visible light. Photosensitivity is an attribute of the above-described resin itself (if necessary, a light absorber or light scattering substance may be added). An emulsion mask or the like, in which an additive composition, such as silver halide, plays a main role in photosensitivity, is, in principle, outside the definition of the term "resist mask" in accordance with the present invention. In other words, the "resist mask" does not exhibit a desired light shielding property for the first time by development, but has already had a light shielding property before development or at the time when applied on a mask substrate. It is needless to say that inclusion of various additives, including such composition, is not prohibited. The resist is usually composed mainly of an organic resin, but addition of an inorganic substance is permitted.

In the field of semiconductor manufacture, ultraviolet rays are classified as follows: A ray having a wavelength less than 400 nm, but about 50 nm or greater, is called "an ultraviolet ray", that having a wavelentgth of 300 greater is called a "near ultraviolet ray", that having a wavelength less than 300 nm, but 200 nm or greater, is called a "far ultraviolet ray", and that having a wavelength less than 200 nm is called a "vacuum ultraviolet ray". Example in this application are described mainly in a vacuum ultraviolet ray region having a wavelength less than 200 nm, but it is needless to say that the present invention can be applied to a far ultraviolet region, by a KrF excimer laser, having a wavelength I ss than 250 nm, but 200 nm or greater, if modification as described later in the Examples is conducted. It is also possible to apply the principle of the present invention even to a short wavelength edge region of ultraviolet rays having a wavelength less than 100 nm, but 50 nm or greater, and a visible short wavelength edge region of about 400 nm to about 500 nm.

6. Halftone phase shift mask: a kind of a phase shift mask having a halftone film which serves as both a shifter and a light shielding film and has a transmittance of 1% or greater, but less than 40%, and a halftone shifter whose phase shift amount relative to that of a portion having no halftone film inverts a phase of light 7. Edge enhanced phase shift mask: a kind of a phase shift mask which has a shifter disposed at the peripheral profile portion of a light transmitting region for transferring patterns.

8. The term "light shielding (light shielding region, light shielding film or light shielding pattern) means that it has optical characteristics permitting transmittance of less than 40% of exposure light radiated on the region. Generally, one permitting transmittance of from several % to less than 30% is used. Particularly in a binary mask (or binary light shielding pattern) used as a substitute for the conventional chromium mask, the transmittance of the light shielding region is almost 0, that is, less than 1%, desirably less than 0.5%, more practically less than 0.1%. The term "transparent (transparent film or transparent region)", on the other hand, means that is has optical characteristics permitting transmittance of 60% or greater of light irradiated on the region. The transmittance of the transparent region is almost 100%, that is, 90% or greater, desirably 99% or greater.

9. The term "metal" in the context of a mask light shielding material means chromium, chromium oxide or a similar metal compound, in a broad sense, a metal-containing a single substance, compound or composite having a light shielding action.

10. The term "resist film" means a film which is usually composed mainly of an organic solvent, a base resin and a photosensitive agent and also contains another component By exposure light, such as ultraviolet rays or an electron beam, the photosensitive agent causes a photochemical reaction and a product of the photochemical reaction or this product of the photochemical reaction as a catalyst causes a large change in a dissolution rate of the base resin in a development solution, whereby patterns are formed by exposure and development subsequent thereto. When a dissolution rate of a base resin in a development solution at an exposure portion increases, such a resist is called a "posi-type resist"; while, when a dissolution rate of a base resin in a development solution at an exposure portion decreases, such a resist is called "nega-type resist". In general, a resist film does not contain an inorganic material in its main component, but an Si-containing resist film is exceptionally embraced in this resist film.

A general difference between a resist film and a photosensitive SOG (Spin On Glass) resides in the fact that the photosensitive SOG contains, in a main component, Si—O or Si—N, and this portion is made of an inorganic material. The main skeleton of the photosensitive SOG is $SiO_2$. Whether it is inorganic or organic is determined by whether it has $CH_3$ or the like bonded at the terminal point thereof or not. In general, the photosensitive SOG is stable and widely used when having an organic terminal. But, either organic or inorganic is usable.

11. In the field of semiconductor manufacture, ultraviolet rays are classified as follows: A ray having a wavelength less than 400 nm, but 50 nm or greater, is called an "ultraviolet ray", that having a wavelength of 300 nm or greater is called a "near ultraviolet ray", that having a wavelength less than 300 nm, but 200 nm or greater, is called a "far ultraviolet ray", and that having a wavelength less than 200 nm is called a "vacuum ultraviolet ray". Examples in this application are described mainly in a vacuum ultraviolet ray region having a wavelength less than 200 nm, but it is needless to say that the present invention can be applied to a far ultraviolet region, by a KrF excimer laser, having a wavelength less than 250 nm, but 200 nm or greater, if modification as described later in the Examples is conducted. It is also possible to apply the principle of the present invention to a short wavelength end region of ultraviolet rays having a wavelength less than 100 nm, but 50 nm or greater.

12. The term "semiconductor integrated circuit device" means not only a device formed over a semiconductor or insulating substrate, such as silicon wafer or sapphire substrate, but also a device formed over another insulating substrate, for example, glass, such as TFT (Thin Film Transistor) or STN (Super Twisted Nematic) liquid crystals, unless otherwise specifically indicated.

13. Hole pattern: a fine pattern such as contact hole or through hole having a two dimensional size equal to or not greater than an exposure wavelength on a wafer. In general, it is square, rectangular, near square or pentagonal on a mask, but in many cases it is circular on the wafer.

14. Line pattern: means a strip pattern constituting an interconnect or the like on a wafer.

In the below-described embodiments, a description will be made after the subject matter is divided in plural sections or into plural embodiments if necessary for convenience's sake. These plural sections or embodiments are not independent from each other, but are in a relation such that one is a modification example, details or complementary description of a part or whole of the other one, unless otherwise specifically indicated.

In the below-described examples, when reference is made to number of elements (including the number, value, amount and range), the number of elements is not limited to the specified number, but can be not greater than or less than the specified number, unless otherwise specifically indicated, or in the case it is principally apparent that the number is limited to the specified number.

Moreover, in the below-described embodiments, it is needless to say that the constituting elements (including element steps) are not always essential, unless otherwise specifically indicated, or in the case where it is principally apparent that they are essential.

Similarly, in the below-described embodiments, when reference is made to the shape or positional relationship of the constituting elements, subject matter substantially analogous or similar to it is also embraced unless otherwise specifically indicated, or in the case where it is utterly different in principle. This also applies to the above-described value and range.

In all of the drawings, elements having like a function will be identified by like reference numerals and overlapping descriptions thereof will be omitted. In the drawings used to illustrate these embodiments, even a plan view is sometimes hatched to facilitate understanding of the drawing.

In the below-described embodiments, a MIS-FET (Metal Insulator Semiconductor Field Effect Transistor) will be abbreviated as MIS, while a p-channel type MIS-FET and an n-channel type MIS-FET will be abbreviated as pMIS and nMIS, respectively.

The embodiments of the present invention will be described specifically with reference to the accompanying drawings.

(Embodiment 1)

In recent years, in the manufacture of a variety of articles that are produced in small numbers, such as an ASIC (Application Specific IC) and a system LSI (Large Scale Integrated circuit), the masks employed in the processing have not been used so frequently, causing an increase in the ratio of the cost of the masks to the overall cost of manufacture of the semiconductor integrated circuit device. Particularly, in a phase shift mask which needs more preparation steps than the ordinarily-employed mask and, moreover, has complex preparation steps, there has been an increase demand for shortening the preparation time and reducing the cost of the mask.

According to a resist mask technique for constituting a light shielding body on a mask substrate from a resist mask, shortening of the preparation time and a reduction in the cost of a mask can be realized. It is therefore desired to apply this resist mask technique to a halftone phase shift mask, which has been used widely because of its easy preparation.

It is necessary, for the preparation of a halftone mask, to simultaneously control the transmittance of the exposure light and the phase stably with a high precision, but many problems remain in the development of a resist material for a halftone phase shift mask; for example, there is a problem in that a change in optical constant is caused by a change in a light absorber in a resist film for a light shielding body due to the irradiation of an exposure light Therefore, the present inventors have investigated a manufacturing method, utilizing a resist mask technique, involving an edge enhanced phase shift mask which method can improve the resolution level to a value equal to that of a halftone phase shift mask. A description of the resist mask can be found in Japanese Patent Application No. Hei 11(1999)185221 (applied on Jun. 30, 1999), Japanese Patent Application No. 2000-246466 (Aug. 15, 2000) or Japanese Patent Application No. 2000-246506 (Aug. 15, 2000) by the present inventors and the like.

An edge enhanced phase shift mask can bring about similar-level improved effects in the resolving performance at any transmittance by optimizing the width of an edge according to the transmittance of exposure light at the edge portion. In this Embodiment, therefore, a shifter is formed at the peripheral profile portion of a light transmitting region by using a resist film or photosensitive SOG film, which is free of a light absorber, is stable and is relatively transparent to irradiation. A resist film for a light shielding body which is employed for a binary mask is used around this portion. This makes it possible to prepare an edge-enhanced phase shift mask from a resist mask instead of a normal mask, the use of which has so far been considered.

Figure 2:
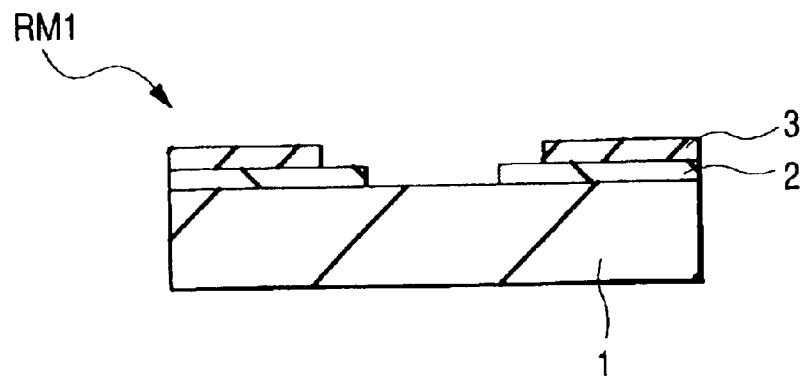
FIG. 2 is a cross-sectional view taken along a line X1—XI of FIG. 1.

FIG. 1 is a fragmentary plan view of an edge enhanced phase shift resist mask RM1 (which will hereinafter simply be described as a "mask RM1") used in the process (exposure treatment) of fabrication of a semiconductor integrated circuit device according to this Embodiment, while FIG. 2 is a cross-sectional view taken along a line X1—X1 of FIG. 1.

Here, a mask RM1 for transferring hole patterns onto a wafer is illustrated. A mask substrate 1 constituting this mask RM1 is made, for example, of a synthetic quartz glass plate, which is transparent to exposure light It has a first main surface and a second main surface on the back side thereof (reverse side). Over the first main surface of this mask substrate 1, there is formed, for example, a first light transmitting region TA1 having a planar square shape. The first light transmitting region TA1 is a transparent region formed by exposing the first main surface of the mask substrate 1. At the peripheral profile portion of this first light transmitting region TA1, a second light transmitting region TA2 in a planar frame form is disposed so as to encompass the light transmitting region TA1, and a light shielding region SA is disposed around the second light transmitting region TA2.

The second light transmitting region TA2 is a region functioning as a phase shifter, and it is formed of a phase shift film (first film) 2 on the first main surface of the mask substrate 1. This phase shift film 2 is made of, for example, the above-described resist film or photosensitive SOG film. The thickness d of the phase shift film 2 can be expressed by $d=\lambda/(2(n-1))$ (wherein x means the wavelength of the exposure light and n stands for the refractive index at the exposure wavelength of the phase shift film 2), and the thickness d is, for example, about 200 nm±6 nm. As the resist material for forming the phase shift film 2, the following resist materials can be given as examples. As the resist material, when the exposure light used in the transfer of patterns to a wafer is an i line ($\lambda$=365 nm), a novolak resin resist is usable. When the exposure light is KrF (($\lambda$=248 nm), a polyhydroxystyrene resin resist is usable as the resist material. When the exposure light is ArF ($\lambda$=193 nm), an ArF resist, such as polymethyl methacrylate (PMMA) or alternating (COMA) type, is usable. When the exposure light is $F_2$ ($\lambda$=157 nm), a fluorine-containing resin resist or ladder silicone is usable as the resist material.

The transmittance of exposure light in the above-described second light transmitting region TA2 is set, for example, at 3% to 100%, 20 to 90% or 50 to 90%, preferably 50%, 60%, 80% or 100%. In this Embodiment 1, it is set at a value between the transmittance of the exposure light in the first light transmitting region TA1 and that in the light shielding region SA. By optimizing the width of this second light transmitting region TA2, a substantially stable resolving performance improving effect can be attained without depending on the transmittance of exposure light through a material constituting the second light transmitting region TA2. Upon formation of the second light transmitting region TA2 from a resist film, it is possible to narrow the light absorbing portion, which has low resistance against irradiation of exposure light in a resist film, as much as possible and to heighten the transmittance of the exposure light, making it possible to use a material that is stable against irradiation of the exposure light In other words, the resist film can be selected more freely. For. example, when the thickness of the resist film for the formation of the second light transmitting region TA2 is set at 0.3 $\mu$m and the transmittance of an exposure light is 10% or greater, the stability against irradiation of the exposure light can be improved greatly.

In the mask RM1 of this Embodiment, the transmittance of the exposure light and the phase in the second light transmitting region TA2 can be simultaneously controlled in a stable manner. By the present technique, the thickness of the resist film for the formation of the second light transmitting region TA2 can be controlled with an accuracy of ±3% or less, and the phase control can also be controlled with high precision. In general, at least the phase must be controlled within 180°±10° in order to improve the resolving performance by the phase shift effect, and the phase of the second light transmitting region TA2 can be controlled with a similar precision depending on the present technique. As a result, a phase shift resist mask capable of achieving an improvement, thereby having a similar resolving power to that of a halftone phase shift mask, can be prepared.

The light shielding region SA is formed by a light shielding film (second film) 3 deposited over the phase shift film 2. In this light shielding film 3, an opening having a planar square shape, with a center coincident with the first light transmitting region TA1, is formed so as to expose the first light transmitting region TA1 and the phase shift film 2 at the peripheral profile portion thereof. The light shielding film 3 has a thickness of, for example, about 0.4 $\mu$m. As the resist material for forming the light shielding film 3, the following resist materials can be given as examples. As the resist material to be used when the exposure light used for transfer of patterns to a wafer is an i line ($\lambda$=365 nm), a novolak resin resist containing 2-hydroxychalcone as a light absorber is usable. When the exposure light is KrF (($\lambda$=248 nm), a novolak resin resist containing anthracenemethanol as a light absorber is usable as the resist material. When the exposure light is ArF ($\lambda$=193 nm) or $F_2$ ($\lambda$=157 nm), a polyhydroxystyrene resin resist or novolak resin resist is usable as the resist material.

For the formation of the phase shift film 2 and the light shielding film 3 from a resist film, either a posi-type or nega-type resist film may be used in consideration of their characteristics. However, a posi-type resist film is however preferred from the viewpoint of preparation of a mask. When a posi-type resist film is used for transferring patterns using an electron beam or the like, only a portion to which hole patterns are to be transferred need be exposed to the electron beam; in short, a relatively small area must be drawn so that the drawing time by an electron beam can be reduced substantially compared with the use of a nega-type resist film. In FIG. 1, "A" represents a size corresponding to the length of one side of the first light transmitting region TA1, while "B" represents a size corresponding to the length of one side of a square opening portion formed by the first light transmitting region TA1 and the second light transmitting region TA2.

Figure 3:
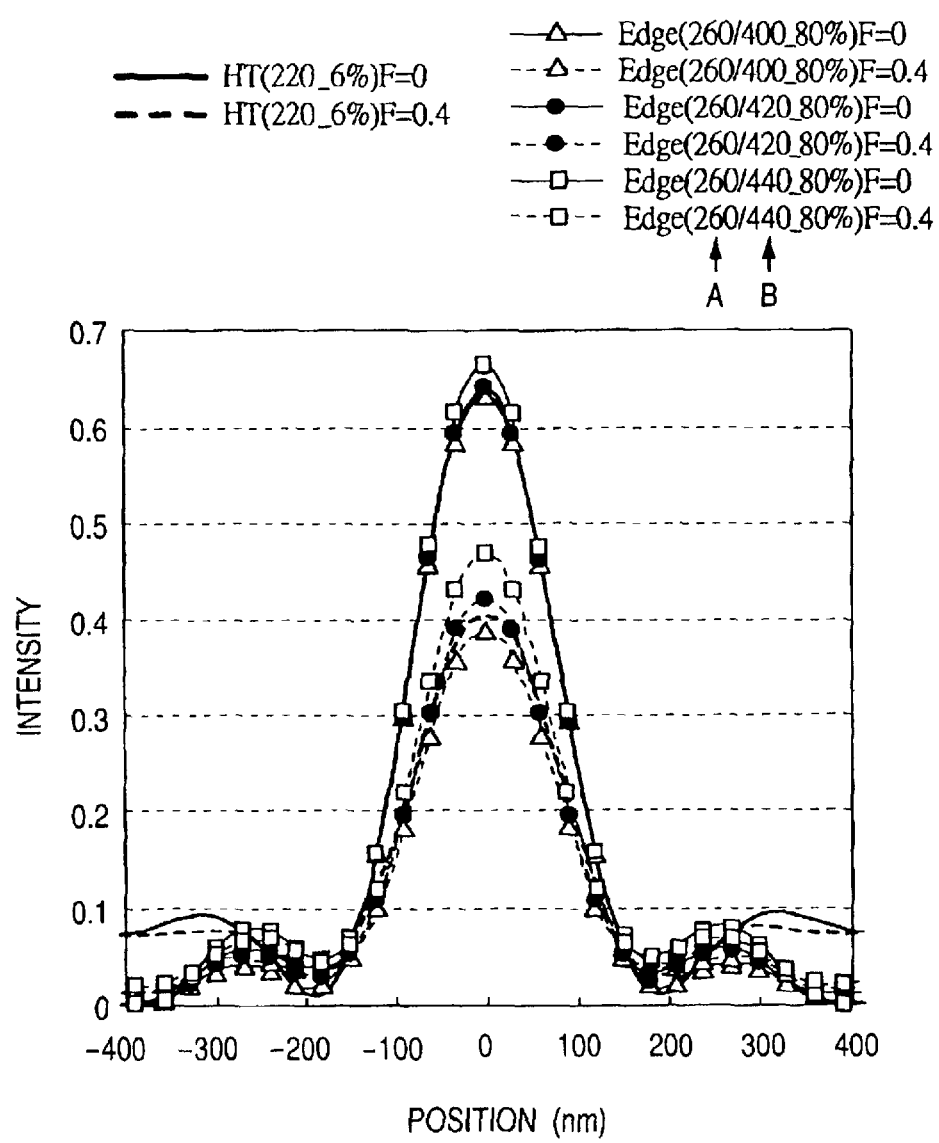
FIG. 3 is a graph illustrating the resolving performance improving effect of the phase shift mask of FIG. 1 compared with that of a halftone phase shift mask.

FIG. 3 is a graph showing the resolving performance improving effect of the mask RM1 compared with the resolving performance of a halfton phase shift mask. In this graph, a mask bias is determined on the assumption that the hole patterns, for example, of 180 to 200 nm are transferred onto a wafer. Results of the calculation of the light intensity distribution "Edge", while setting the size A at about 260 nm, the size B at about 400 to 440 nm and the transmittance of the second light transmitting region TA2 at about 80%, are shown in this graph, together with the light intensity distribution "OHT" produced by a popularly used halftone phase shift mask having a transmittance of about 6%. The exposure conditions employed here were: KrF ($\lambda$=248 nm) as an exposure light, numerical aperture of the projection lens NA=0.68 and coherence $\sigma$=0.50 (which will hereinafter be called the "first exposure conditions). In FIG. 3, F means focus, more specifically, F=0 means the best focus and F=4 means a 0.4 $\mu$m defocus. For example, when the size B is 420 nm, the light intensity distribution is almost similar to the light intensity distribution HT of a 6% halftone phase shift mask at either the best focus or a 0.4 $\mu$ml defocus.

Figure 4:
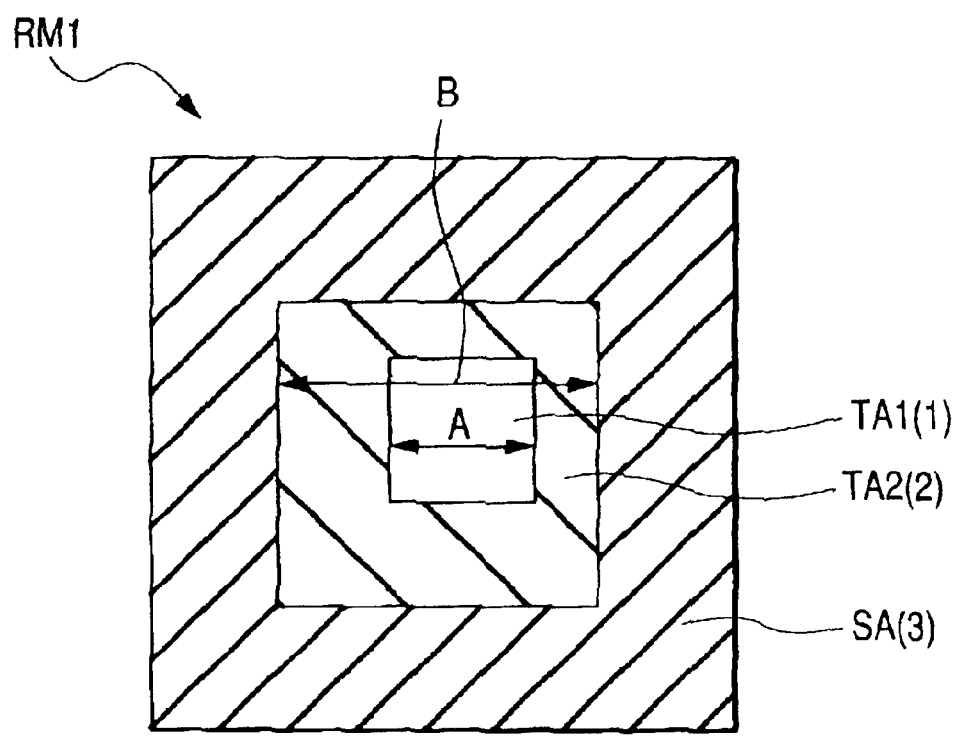
FIG. 4 is a fragmentary plan view of a phase shift mask in the case where a misalignment occurs between the first light transmitting region and the second light transmitting region at the outer periphery of the first light transmitting region in the phase shift mask of FIG. 1.

In this Embodiment 1, drawing is conducted twice for the preparation of the mask RM1, as will be described later, so that there is a fear that a misalignment will occur during such drawing processes which will have an adverse effect on the result FIG. 4 is a fragmentary pan view of the mask RM1 showing the result when an offset occurs between the first light transmitting region TA1 and the second light transmitting region TA2 at the peripheral profile portion of the region TA1. The transmittance of exposure light through the second light transmitting region TA2 is, for example, about 80%. The size A is, for example, about 260 nm and the size B is about 420 nm.

Figure 5:
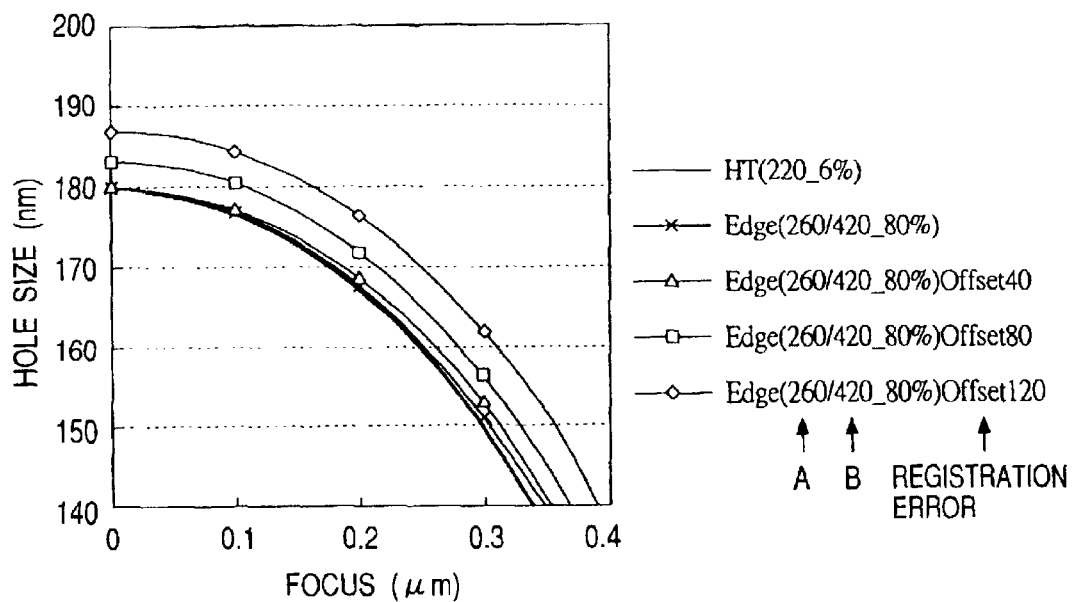
FIG. 5 is a graph illustrating a change in hole size in the case where a misalignment occurs between the first light transmitting region and the second light transmitting region at the outer periphery of the first light transmitting region in the phase shift mask of FIG. 1.

FIG. 5 illustrates the hole size when, in the mask RM1 of this Embodiment 1, misalignment between the first light transmitting region TA1 and the second light transmitting region TA2, which is the peripheral profile portion of TA1 both in the direction X (horizontal direction in FIG. 4) and in the direction Y (perpendicular direction in FIG. 4), becomes, for example, about 40, 80, or 120 nm (the size on a phase shift resist mask, which is presumed to be greater by 4 times so that it corresponds to 10, 20 or 30 nm on a wafer). If the allowance of a change in the hole size due to misalignment is, for example, about 5 nm, an offset of about 80 nm can be permitted, even if a defocus of 0.3 gm is taken into consideration. There is a fear that the size peak value becomes higher on the side where the second light transmitting region TA2 becomes wider due to the offset, causing a decrease in the size peak transfer margin.

Figure 6:
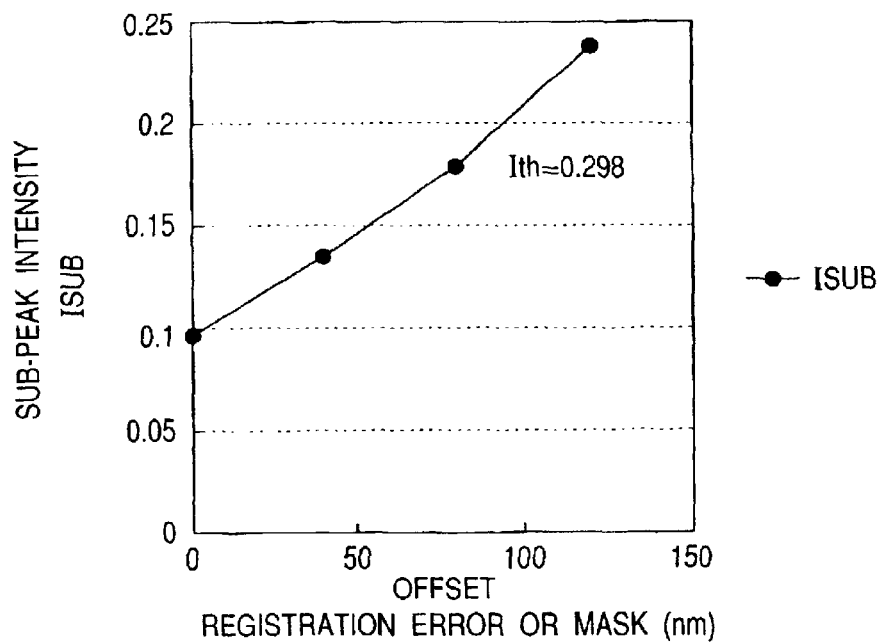
FIG. 6 is a graph showing the evaluation results of a side peak transfer margin caused by the misalignment of the second light transmitting region in the phase shift mask of FIG. 1.

The evaluation results are shown in FIG. 6. Ith means the threshold value of the subpeak strength. This threshold value Ith is, for example, 0.298. When the threshold value exceeds this value, the subpeak is transferred onto a resist film on a wafer. It is apparent from FIG. 6 that there exists a sufficient margin for side peak transfer when the offset is <100 nm in terms of the size on a mask. Exposure conditions are, for example, similar to the above-described first exposure conditions. The alignment precision of the present electron beam drawing apparatus is about 100 nm, so that the above-described alignment precision can be easily attained.

Figure 7:
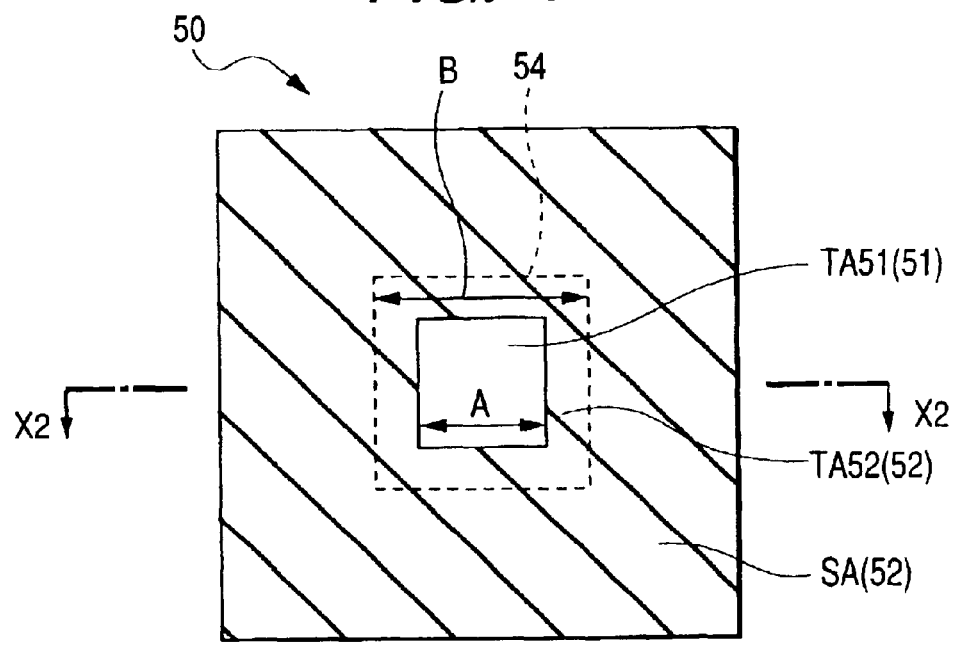
FIG. 7 is a fragmentary plan view of a self-align system edge-enhanced phase shift resist mask manufactured using the wet etching method investigated by the present inventors.
Figure 8:
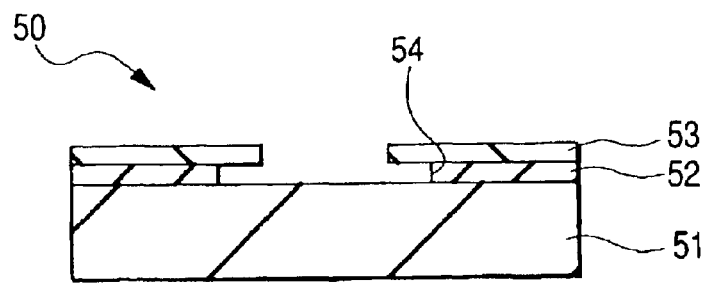
FIG. 8 is a cross-sectional view taken along a line X2—X2 of FIG. 7.

FIG. 7 shows, for comparison, a fragmentary plan view of a self-align system edge-enhanced phase shift resist mask 50 that is formed by using a wet etching method investigated by the present inventors, and FIG. 8 is a cross sectional view taken along a line X2—X2 of FIG. 7.

Over the first main surface of a mask substrate 51 of this edge-enhanced phase shift resist mask 50, a phase shift film 53 is deposited via a light shielding film 52. The light shielding film 52 is made of a water soluble organic light shielding material, while the phase shift film 53 is mad of a resist mat rial. In the light shielding film 52, there is an opening 54 having a planar square shape which is formed so as to expose the first main surface of the mask substrate 1. The size B of the opening portion 54 is, for example, about 380 to 460 nm. In the phase shift film 53, a first light transmitting region TA51 of planar square shape, having a center coincident with the opening portion 54 and is smaller than the opening portion 54, is opened. The size of this first light transmitting region TA51 is, for example, about 260 nm. A planarly overlapping portion of the phase shift film 53 with the opening portion 54 at the peripheral profile portion of this first light transmitting region TA51 forms a second light transmitting region TA52. With this technique, upon formation of the opening portion by removal of a portion of the phase shift film 53 that is deposited over the first main surface of the mask substrate 51 by photolithography, the water soluble light shielding film 52 is removed simultaneously. The light shielding film 52, that is exposed from the side surface portion of this opening portion, is dissolved in the transverse direction, thereby forming a pentroof structure with the phase shift film 53. Therefore, no misalignment between the first light transmitting region TA51 and the second light transmitting region TA52 will occur, but it is difficult to control the edges on the side surfaces of the opening portion 54 of the light shielding film 52.

Figure 9:
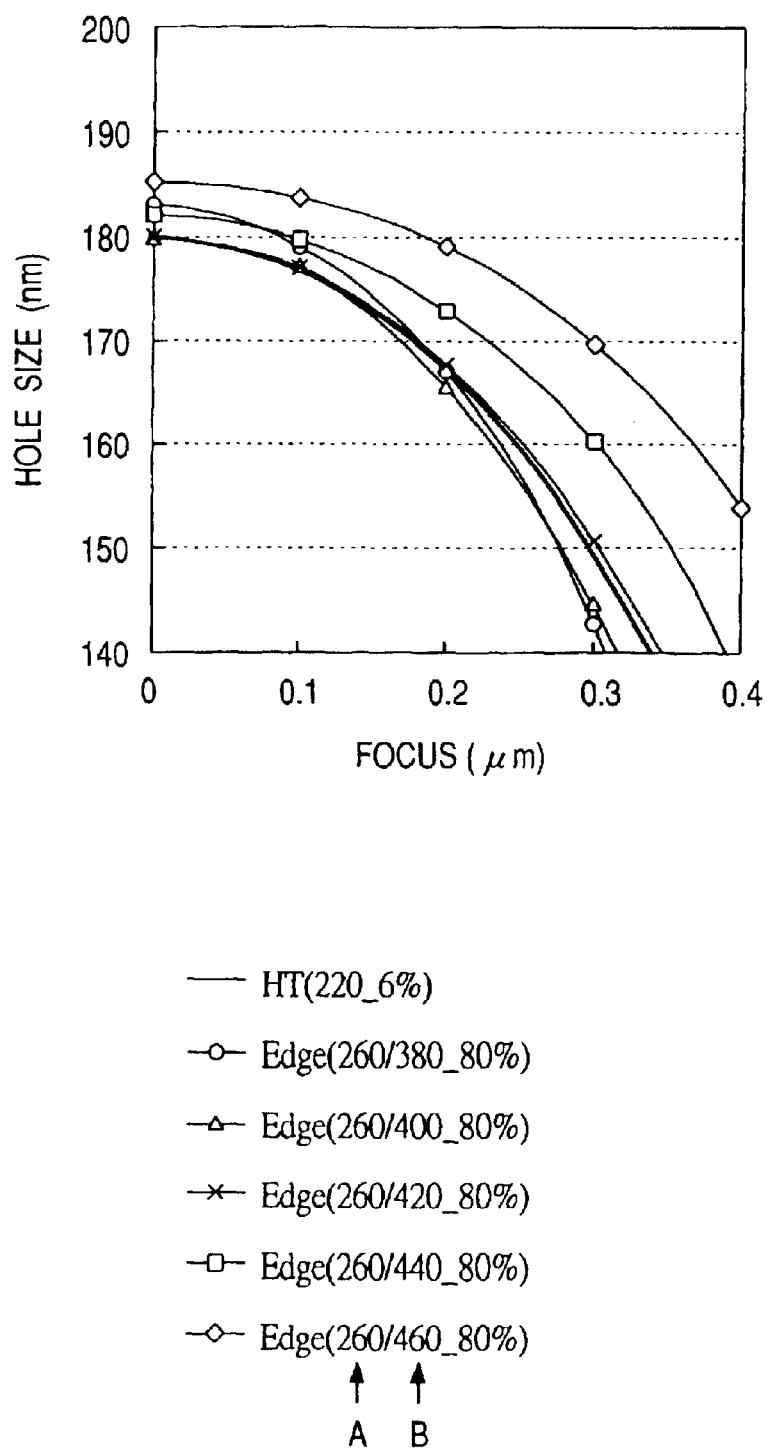
FIG. 9 is a graph showing the results of evaluation of the influence of variations in an edge region width in the self-align system edge-enhanced phase shift resist mask of FIG. 7 or FIG. 8.

FIG. 9 shows the evaluation results of the influence of a change in the edge region width in the self-align system edge-enhanced phase shift resist mask 50 in FIG. 7 and FIG. 8. The curves show the relationship between the focus and hole size when the size B is changed. If a change in the hole size due to a change in the width of the edge region is suppressed to 5 nm or less at a defocus amount set at not greater than 0.3 $\mu$m, the edge region width must be controlled to 420 ±10 nm in terms of the size on a wafer. Assuming that a mask has patterns 4 times larger than they are on the final product, a control precision of the edge position within ±40 nm in terms of the size on a mask is necessary. The exposure conditions here are similar to the first exposure conditions. If the thickness of the resist film on the mask is not greater than 0.3 $\mu$m, it seems to be very difficult to control the precision of the edge position within ±40 nm by wet etching. The above-described self align system edge-enhanced phase shift resist mask technique is disclosed by the present inventors in Japanese Patent Application No. 2000-278665 (applied on Sept. 8, 2000).

A predetermined mark, such as alignment mark formed on the mask RM1, will next be described with reference to FIGS. 10 to 21. FIGS. 10 to 15 illustrate the case where the resist film over the mask substrate 1 is a posi-type resist film, while FIGS. 16 to 21 illustrate the case where the resist film over the mask substrate 1 is a nega-type resist film.

Figure 10:
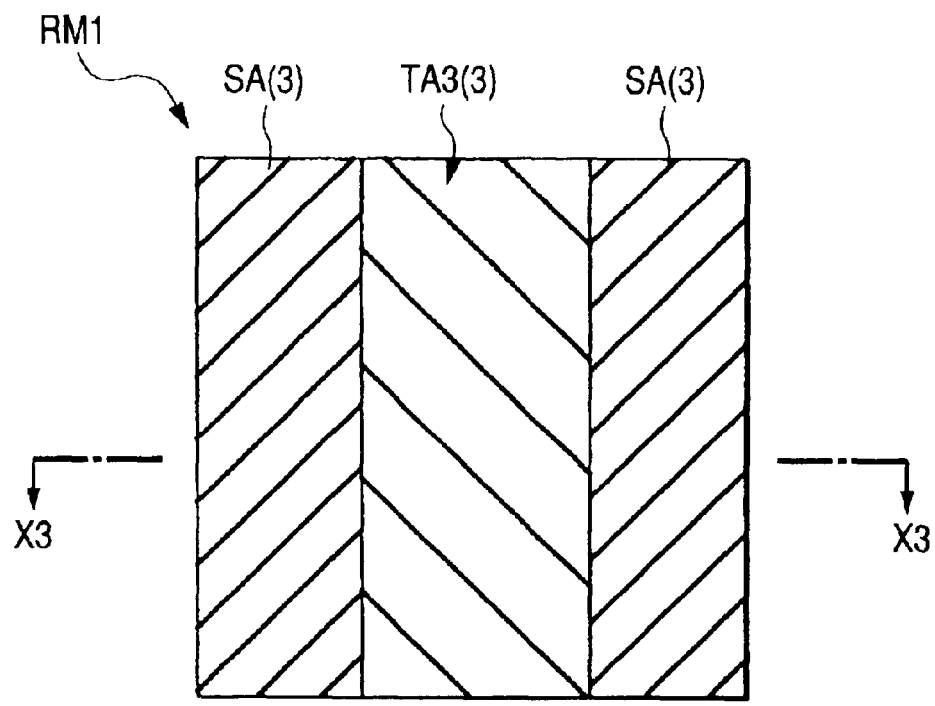
FIG. 10 is a fragmentary plan view of the mark region of the phase shift mask of FIG. 1.
Figure 11:
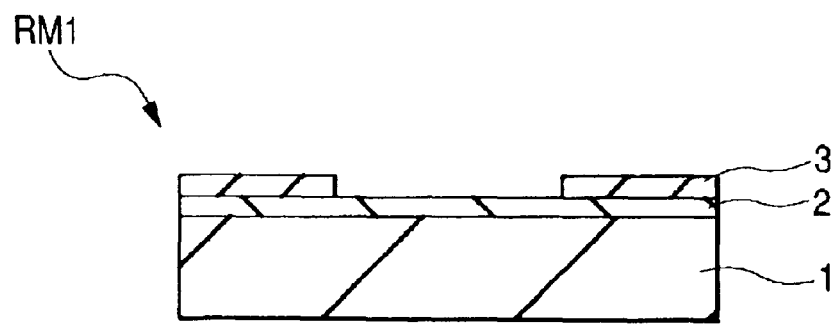
FIG. 11 is a cross-sectional view taken along a line X3—X3 of FIG. 10.

FIG. 10 is a fragmentary plan view of a mark region of mask RM1, and FIG. 11 is a cross-sectional view taken along a line X3—X3 of FIG. 10. Over the first main surface of the mask substrate 1, a light shielding film 3 is deposited via a phase shift film 2. A portion of the light shielding film 3 is opened so as to expose the underlying phase shift film 2, whereby a third light transmitting region TA3 is formed. This third light transmitting region TA3 is a pattern for the formation of the mark. The third light transmitting region TA3 is covered all over with the phase shift film 2, and within this third light transmitting region TA3, inversion of the phase of the transmitted light does not occur. The transmittance of exposure light through the third light transmitting region TA3 is equal to that through the second light transmitting region TA2.

Figure 12:
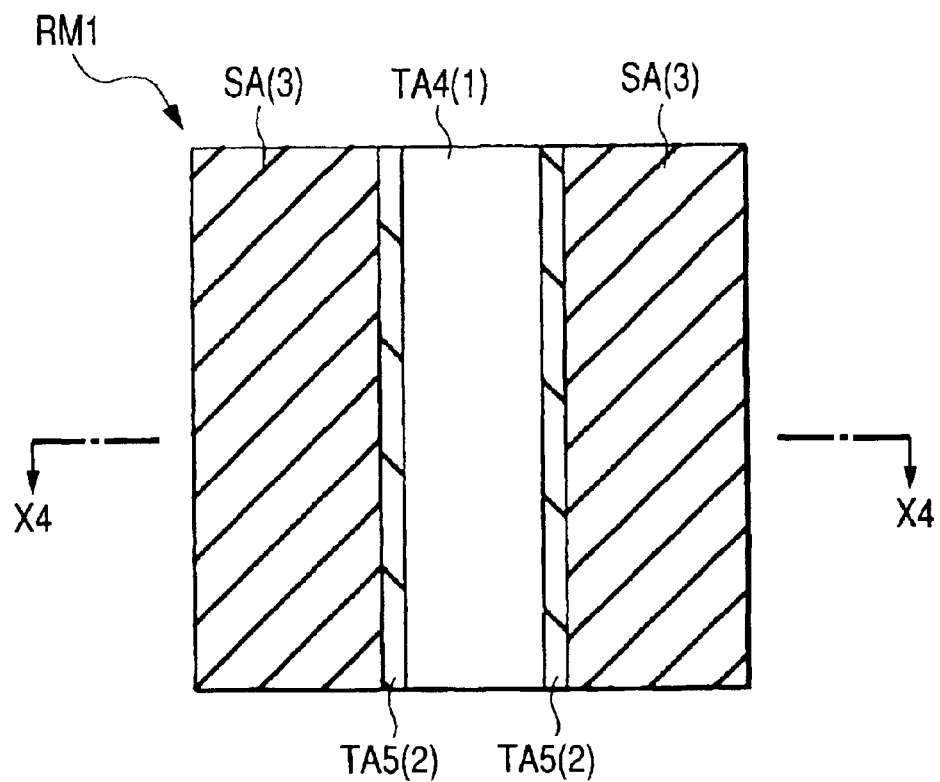
FIG. 12 is a fragmentary plan view of another example of the mark region of the phase shift mask of FIG. 1.
Figure 13:
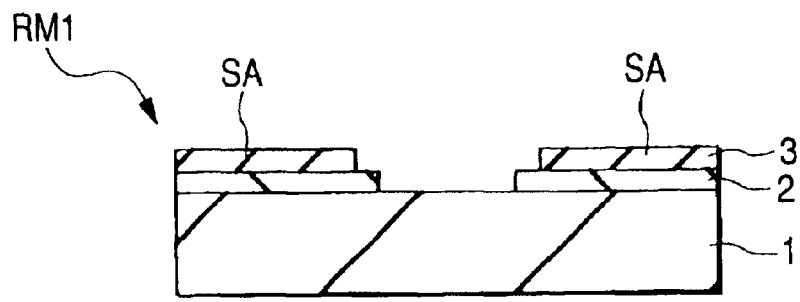
FIG. 13 is a cross-sectional view taken along a line X4–X4 of FIG. 12.

FIG. 12 is a fragmentary plan view illustrating another example of a mark region of mask RM1, and FIG. 13 is a cross-sectional view taken along a line X4—X4 of FIG. 12. Over the first main surface of the mask substrate 1, for example, a fourth light transmitting region TM having a planar strip shape is formed. This fourth light transmitting region TA4 is a transparent region formed by exposing the first main surface of the mask substrate 1. The light transmittance of exposure light through this region is equal to that through the first light transmitting region TA1. At the peripheral profile portion of this fourth light transmitting region TA4, a fifth light transmitting region TA5 is disposed, and outside of this fifth light transmitting region TA5, a light shielding region SA is disposed. The fifth light transmitting region TA5 is made of a phase shift film 2, and the transmittance and phase of the exposure light is similar to those of the second light transmitting region TA2. The fourth light transmitting region TA4 and fifth light transmitting region TA5 are patterns for forming the above-described mark.

Figure 14:
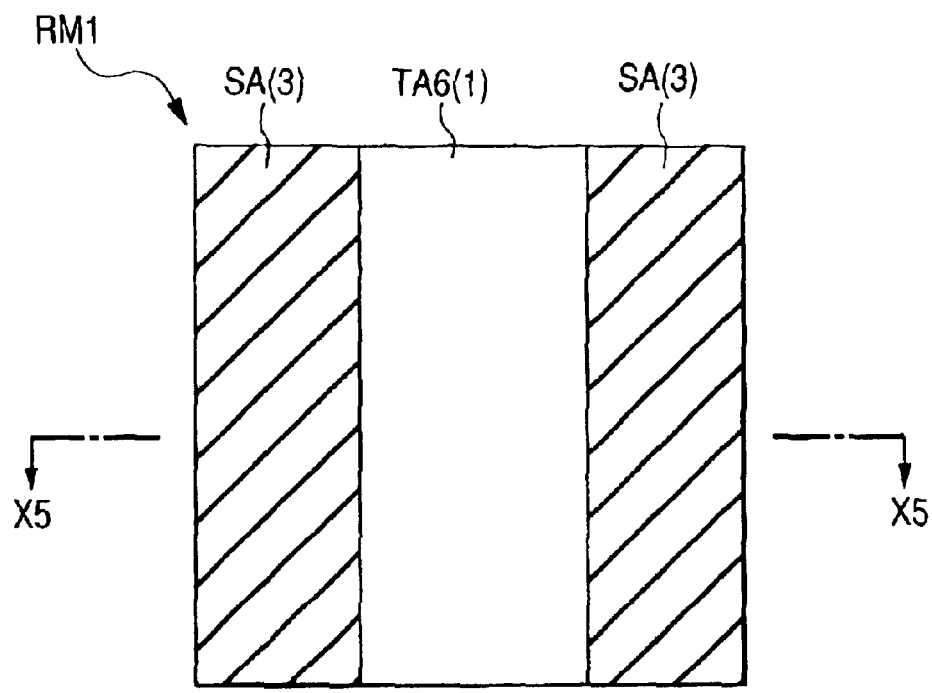
FIG. 14 is a fragmentary plan view of a further example of the mark region of the phase shift mask of FIG. 1.
Figure 15:
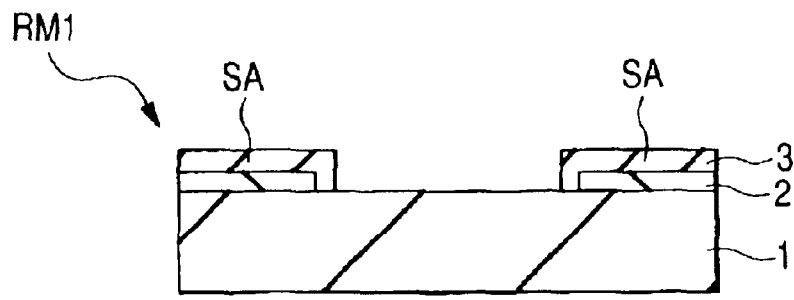
FIG. 15 is a cross-sectional view taken along a line X5—X5 of FIG. 14.

FIG. 14 is a fragmentary plan view illustrating a further example of the mark region of mask RM1, and FIG. 15 is a cross-sectional view taken along a line X5—X5 of FIG. 14. Over the first main surface of the mask substrate 1, for example, a sixth light transmitting region TA6 having a planar strip shape is formed. This sixth light transmitting region TA6 is a transparent region formed by exposing the first main surface of the mask substrate 1, and the transmittance of an exposure light through this region is equal to that through the first light transmitting region TA1. This sixth light transmitting region TA6 is a pattern for forming the above-described mask. Outside of this sixth light transmitting region TA6, a light shielding region SA is disposed. The surfaces of the phase shift film 2 (its upper surface and side surfaces on the side of the sixth light transmitting region TA6) are covered with the light shielding film 3, so as not to expose the phase shift film 2 on the sixth light transmitting region TA6.

Figure 16:
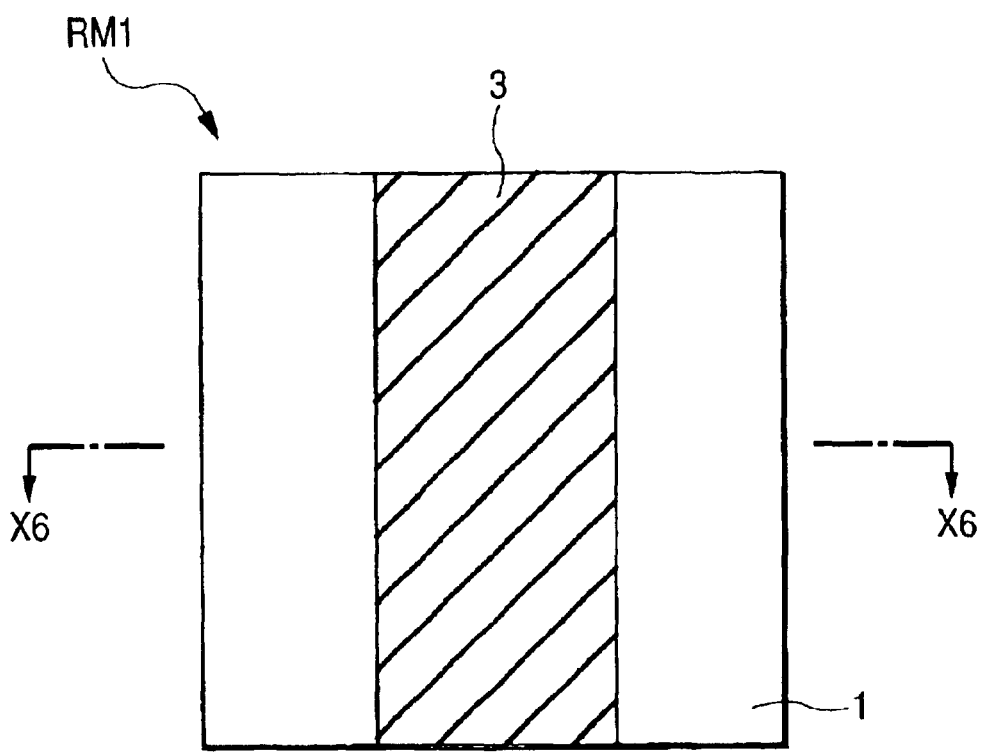
FIG. 16 is a fragmentary plan view of a still further example of the mark region of the phase shift mask of FIG. 1.
Figure 17:
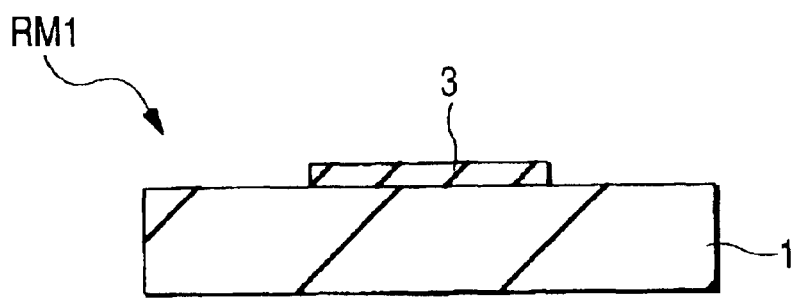
FIG. 17 is a cross-sectional view taken along a line X6—X6 of FIG. 16.

FIG. 16 is a fragmentary plan view illustrating a still further example of the mark region of mask RM1, and FIG. 17 is a cross-sectional view taken along a line X6—X6 of FIG. 16. The mark structure illustrated in FIG. 16 or FIG. 17 is similar to that illustrated in FIG. 10 or FIG. 11 except that it is prepared using a nega-type resist film. Over the first main surface of the mask substrate 1, a pattern of the light shielding film 3 in a planar strip shape is formed. This pattern of the light shielding film 3 is encompassed by a transparent light transmitting region. Here, the pattern of this light shielding film 3 is a pattern for forming the above-described mark.

Figure 18:
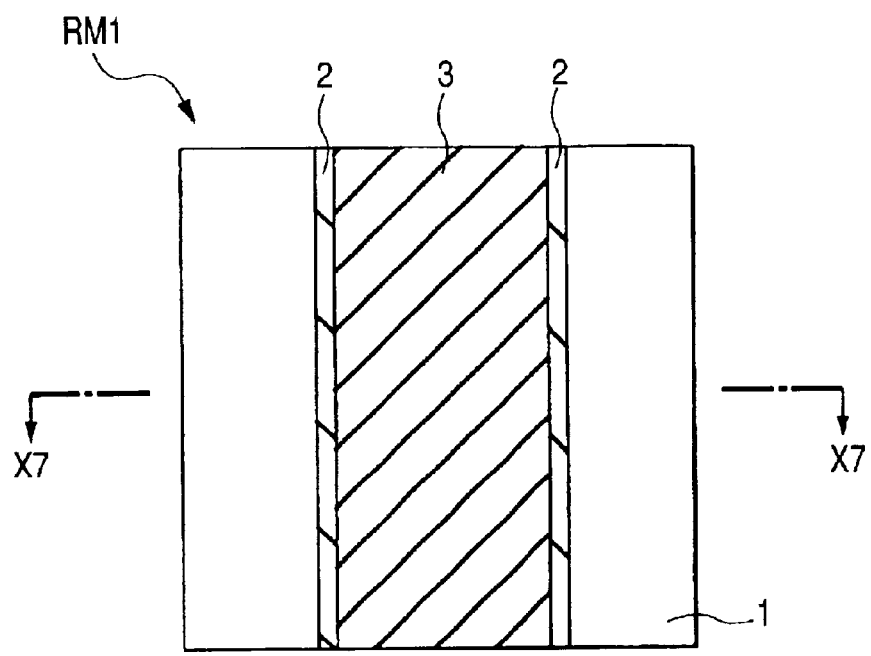
FIG. 18 is a fragmentary plan view of a still further example of the mark region of the phase shift mask of FIG. 1.
Figure 19:
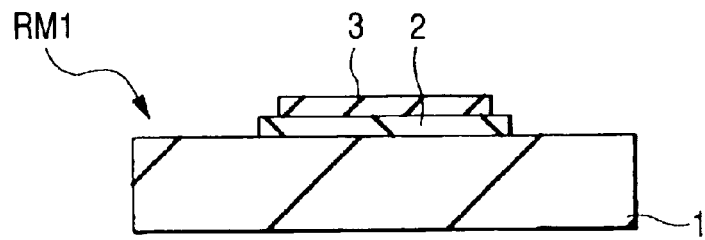
FIG. 19 is a cross-sectional view taken along a line X7—X7 of FIG. 18.

FIG. 18 is a fragmentary plan view illustrating a still further example of the mark region of mask RM1, while FIG. 19 is a ross-sectional view taken along a line X7—X7 of FIG. 18. The mark structure illustrated in FIG. 18 or FIG. 19 is similar to that illustrated in FIG. 12 or FIG. 13 except that it is prepared using a nega-type resist film. Over the first main surface of the mask substrate 1, a pattern of the phase shift film 2 in the planar strip shape is formed. Over the pattern of this phase shift film 2, a pattern of the light shielding film 3 having a planar strip shape a little narrower than the pattern of the phase shift film 2 is formed. In other words, the phase shift film 2 is disposed at the peripheral profile portion of the pattern of the light shielding film 3, and it is then encompassed by a transparent light transmitting region. Here, the patterns of this phase shift film 2 and light shielding film 3 are patterns for forming the above-described mark.

Figure 20:
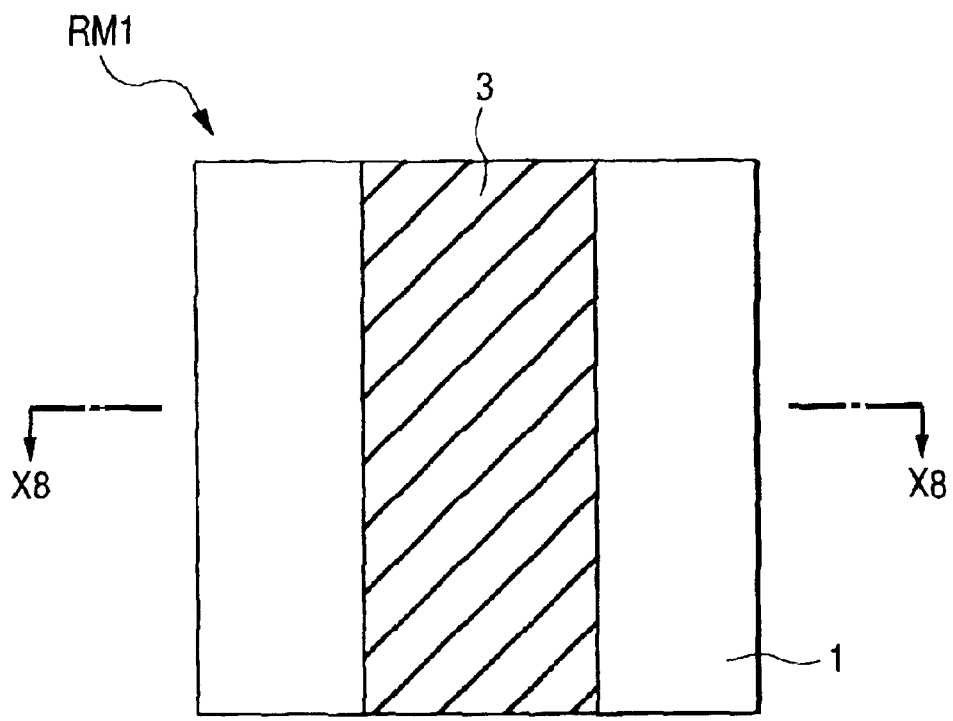
FIG. 20 is a fragmentary plan view of a still further example of the mark region of the phase shift mask of FIG. 1.
Figure 21:
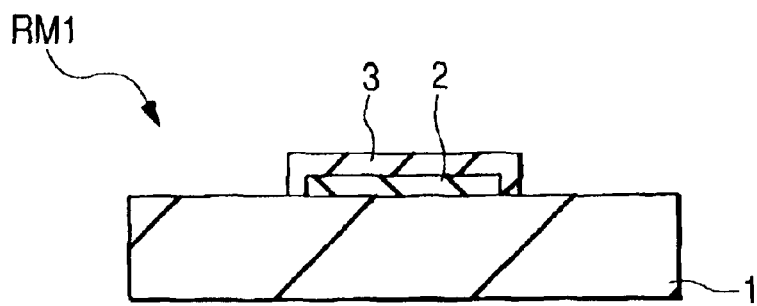
FIG. 21 is a cross-sectional view taken along a line X8—X8 of FIG. 20.

FIG. 20 is a fragmentary plan view illustrating a still further example of a mark region of mask RM1, and FIG. 21 is a cross-sectional view taken along a line X8—X8 of FIG. 20. The mark structure illustrated in FIG. 20 or FIG. 21 is similar to that illustrated in FIG. 14 or FIG. 15, except that it is formed using a nega-type resist film. Over the first main surface of the mask substrate 1, a pattern of a phase shift film 2 having a planar strip shape is formed. A pattern of a light shielding film 3 having a planar strip shape a little wider than the pattern width of the phase shift film 2 is formed so as to cover the whole surface (upper surface and side surfaces) of the pattern of the phase shift film 2. The light shielding film 3 is encompassed by a transparent light transmitting region. The pattern of the light shielding film 3 is a pattern for forming the above-described mask. In the mark region of the mask RM1, the FB drawing time can be shortened, or problems such as side peak transfer can be avoided, by adopting the structures as illustrated in FIGS. 10 to 21.

Figure 22:
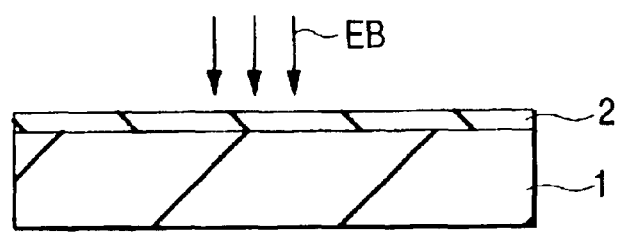
FIG. 22 is a fragmentary cross-sectional view as seen during a step of the manufacture of the phase shift mask of FIG. 1.
Figure 23:
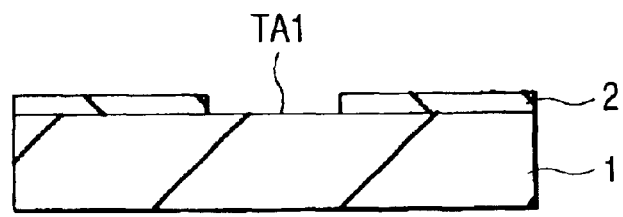
FIG. 23 is a fragmentary cross-sectional view as seen during a step of the manufacture of the phase shift mask following FIG. 22.

One example of a method of manufacture of the mask RM1 in FIG. 1 will be described with reference to FIGS. 22 and 23. FIGS. 22 and 23 are fragmentary cross-sectional views, during the manufacturing step, of mask RM1.

As illustrated in FIG. 22, a transparent mask substrate 1 having first and second main surfaces are prepared. A posi-type resist film is coated over the first main surface to form a phase shift film 2. For the formation of the phase shift film 2, a photosensitive SOG film may be employed instead of the resist film. Then, a pattern is drawn by selectively exposing, to an electron beam EB, a region of the phase shift film 2 on which a first light transmitting region is to be formed. Development is conducted to remove the region which has been exposed to the electron beam EB, whereby a first light emitting region TA1, from which the first main surface of the mask substrate 1 is exposed, is formed in the phase shift film 2, as illustrated in FIG. 23.

Figure 24:
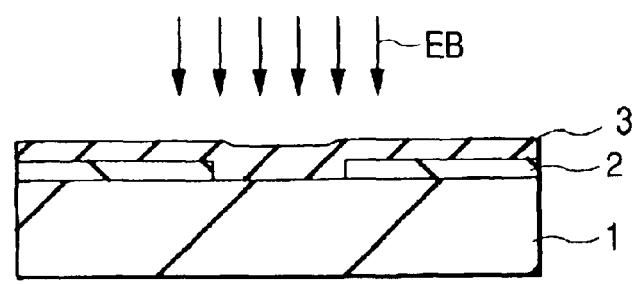
FIG. 24 is a fragmentary cross-sectional-view as seen during a step of the manufacture of the phase shift mask following FIG. 23.

As illustrated in FIG. 24, a posi-type resist film for the formation of a light shielding film 3 is coated on the first main surface of the mask substrate 1 so as to cover the phase shift film 2 and the exposed surface of the mask substrate 1, through the first light transmitting region TA1. Regions of the light shielding film 3, in which a first light transmitting region and a second light transmitting region are to be formed, are then selectively exposed to an electron beam EB to draw a pattern. In order to prevent dissolution of the constituents of the phase shift film 2 in the constituents of the light shielding film 3, it is preferred to add a hardening treatment by baking or the like prior to the application of the resist film for the formation of the third light shielding film 3. Development is then conducted to remove the regions exposed to an electron beam EB, whereby the mask RM1, as illustrated in FIG. 1, is manufactured. Prior to the above-described twice exposure to an electron beam EB, application of a water soluble conductive organic film may be laid over the phase shift film 2 or light shielding film 3. Examples of the water soluble conductive organic film include "Espacer" (trade name; product of Shows Denko K. K.) and "Aquasave" (trade name; product of Mitsubishi Rayon Company, Limited). During exposure to an electron beam EB, the water soluble conductive organic film is electrically connected to ground. After exposure to an electron beam EB is completed, the water soluble conductive organic film is removed upon development of the resist film constituting the phase shift film 2 or light shielding film 3. This method makes it possible to prevent charging with the electron beam EB, thereby preventing such inconveniences as an abnormality of the pattern shape and misalignment of the patterns.

Figure 25:
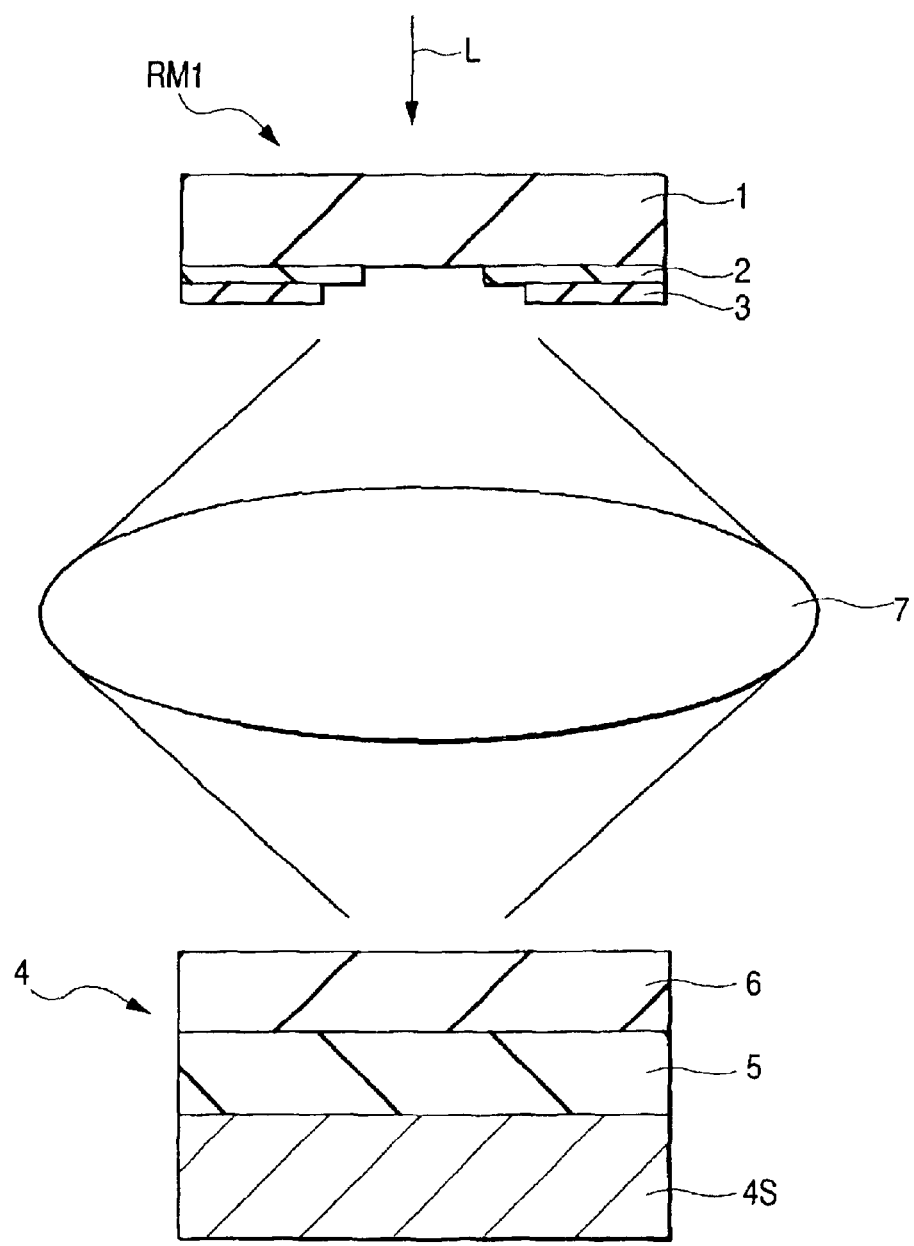
FIG. 25 is a schematic view of the state of exposure treatment using the phase shift mask of FIG. 1.

The exposure treatment using the mask RM1 of Embodiment 1 is schematically shown in FIG. 25.

A semiconductor substrate (which will hereinafter be simply called a "substrate") 4S of a wafer 4 is made of, for example, silicon (Si) single crystal, and on its main surface (surface on which a device is to be formed), predetermined semiconductor circuit lements have been formed. Over the main surface of the substrate 4S, an interlevel insulating film 5 is d posited. The interlevel insulating film 5 is made of, for example, silicon oxide ($SiO_2$), over which, for example, a posi-type photoresist film 6 has been coated.

The mask RM1 is disposed above the main surface of the wafer 4, with a projection lens 7 of the projection exposure reduction equipment disposed therebetween. The mask RM1 is held under a state which permits free attachment or removal, so that the first main surface of the mask RM1 will be directed toward the projection lens 7. Upon exposure, an exposure light L, which is irradiated from the side of the second main surface of the mask RM1 passes through the first main surface of the mask RM1, and is incident on the projection lens 7. By use of this projection lens 7, projection exposure reduction of the mask pattern of the mask RM1 to the photoresist film 6 of the wafer 4 is conducted. At the mask RM1, 180° phase inversion of the light transmitted through the first light transmitting region TA1 and the light transmitted through the second light transmitting region TA2 occurs. This makes it possible to steepen the rise and break of an edge in the waveform of the light transmitted through the first light transmitting region TA1, thereby improving the degree of resolution or a projected pattern. The exposure system may be either a step and repeat system or a step and scan system.

Figure 26:
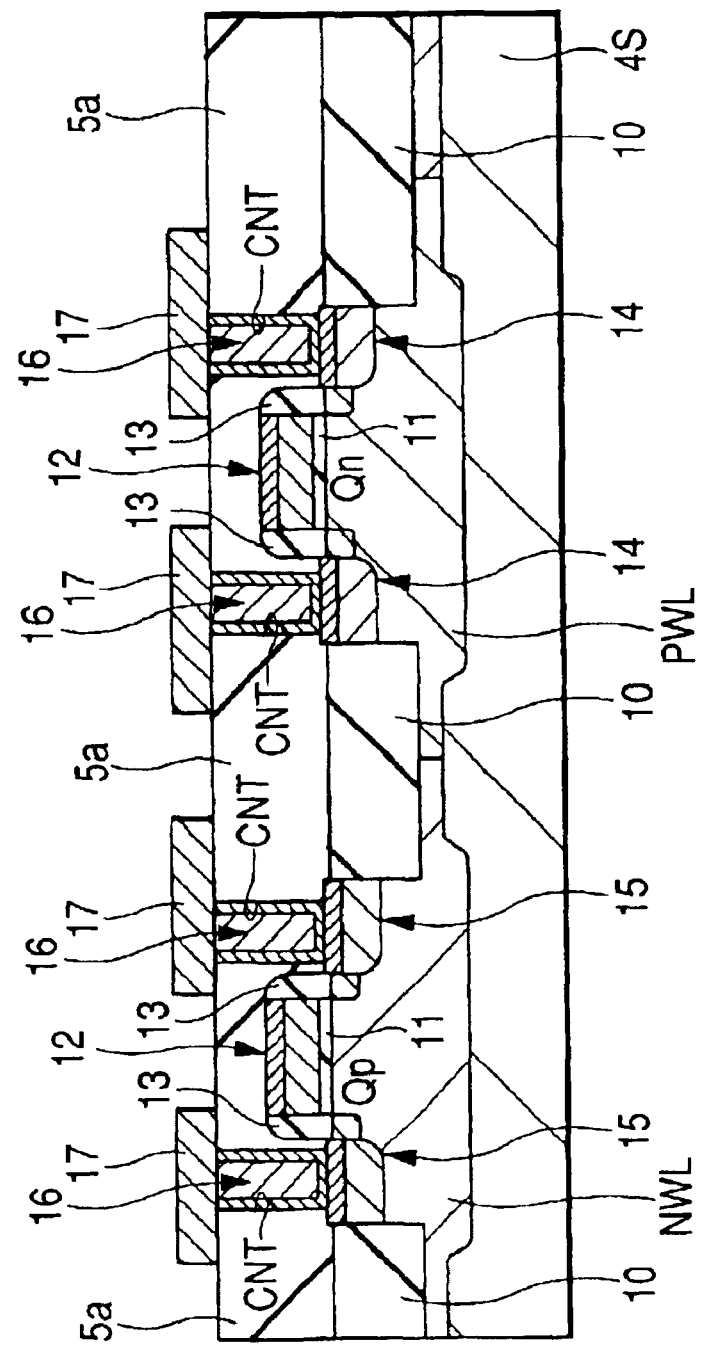
FIG. 26 is a fragmentary cross-sectional view of one example of a semiconductor integrated circuit device, during manufacture, according to one embodiment of the present invention.

Application of the technique of Embodiment 1 to a process for the fabrication of a semiconductor integrated circuit device having, for example, a CMIS circuit, will be described. FIG. 26 is a fragmentary cross-sectional view, during fabrication, of a semiconductor integrated circuit device according to Embodiment 2.

A substrate 4S constituting a wafer 4 is made of, for example, p-type single crystal silicon having a specific resistance of about 1 to 10 Ωcm. In the main surface (a surface on which a device is to be formed) of the substrate 4S, an isolation portion having a groove shape (SGI (Shallow Groove Isolation) or STI (Shallow Trench Isolation)) 10 is formed. This isolating portion 10 of groove shape is formed by embedding, for example, a silicon oxide film ($SiO_2$) or the like in the groove formed on the main surface of the substrate 4S. On the main surface side of the substrate 4S, a p-type well PWL and an n-type well NWL are formed. In the p-type well PWL, for example, boron is introduced, while in the n-type well NWL, for example, phosphorus is introduced. On active regions of the p-type well PWL and n-type well NWL surrounded by the isolation portion 2, nMISQn and pMISQp devices are formed.

The gate insulating film 11 of each of the nMISQn and pMISQP devices is made of, for example, a silicon oxide film having a thickness of 6 nm. The thickness of the gate insulating film means the thickness of a film in terms of silicon oxide (which will hereinafter be called a "converted film thickness), and it sometimes does not coincide with the actual film thickness. The gate insulating film 11 may be made of a silicon oxynitride film instead of a silicon oxide film. In other words, nitrogen is segregated on the interface between the gate insulating film 11 and the substrate 4S. Since a silicon oxynitride film is, compared with a silicon oxide film, highly effective for suppressing generation of an interface level in the film, or for reducing electron traps, the hot carrier resistance of the gate insulating film 11 and also the dielectric strength can be improved. Moreover, since impurities do not easily penetrate through the silicon oxynitride film compared with a silicon oxide film, use of it can suppress variations In the threshold voltage due to diffusion of impurities in the gate electrode material on the side of the substrate 4S. For the formation of the silicon oxynitride film, the substrate 4S may be heat treated in a nitrogen n-gas-containing atmosphere, for example, NO, $NO_2$ or $NH_3$.

The gate insulating film 11 may be formed of, for example, a silicon nitride film or a composite insulating film formed of a silicon oxide film and a silicon nitride film. If the gate insulating film 11, made of a silicon oxide film, is thinned to less than 5 nm thick, particularly less than 3 nm thick, in the above-described converted film thickness, a lowering of dielectric breakdown owing to occurrence of a direct tunnel current or a hot carrier due to stress becomes apparent. A silicon nitride film has a higher dielectric constant than a silicon oxide film, so that its converted film thickness becomes thinner than the actual film thickness. In other words, even if a silicon nitride film is physically thick, its capacity is similar to that of a relatively thin silicon oxide film. By constituting the gate insulating film 11 from a single silicon nitride film or a composite film thereof with a silicon oxide film, the effective film thickness can be increased compared with that of the gate insulating film made of a silicon oxide film, making it possible to alleviate a lowering of the dielectric breakdown caused by occurrence of a direct tunnel current or hot carrier due to stress.

The gate electrode 12 of each nMISQn and pMISQp device is formed by stacking, for example, a titanium silicide ($TISi_{x}$) layer or cobalt silicide ($CoSi_x$) layer over a low resistance polycrystalline silicon film. However, the structure of the gate electrode 12 is not limited to this. Alternatively, it may be a so-called polymetal gate structure formed of a laminate film of, for example, a low resistance polycrystalline silicon film, a WN (tungsten nitride) film and a W (tungsten) film. On the side surface of the gate electrode 12, side walls 12 are formed of, for example, silicon oxide.

Semiconductor regions 14 for a source and drain of the nMISQn device have an n⁻type semiconductor region adjacent to a channel and an n⁺type semiconductor region which is connected to the n⁻type semiconductor region and disposed away from the channel by a space corresponding to the n⁻type semiconductor region. To the n⁻type semiconductor region and n⁺type semiconductor region, for example, phosphorus or arsenic has been introduced. On the other hand, semiconductor regions 15 for a source and drain of the pMISQp device have a p⁻type semiconductor region adjacent to a channel and a p⁺type semiconductor region which is connected to the p⁻type semiconductor region and disposed away from the channel by a space corresponding to the p⁻semiconductor region. To the p⁻type semiconductor region and p⁺type semiconductor region, for example, boron has been introduced. All over the upper surface of these semiconductor regions 14,15, a silicide layer, such as titanium silicide or cobalt suicide layer, is formed.

Over the substrate 4S, an interlevel insulating film 5a is deposited. This interlevel insulating film 5a is made of a material having a high reflow property, which can be embedded in a narrow space between gate electrodes 12,12, for example, a BPSG (Boron-doped Phospho Silicate Glass) film. Alternatively, it may be made of an SOG (Spin On Glass) film formed by spin coating. In the interlevel insulating film 5a, fine plural contact holes (hole patterns) CNT are formed. From the bottom of each of the contact holes CNT, a portion of the upper surface of each of the semiconductor regions 14,15 is exposed. In the formation (exposure) of these contact holes CNT, the above-described mask RM1 (refer to FIG. 1) is used. These contact holes are formed, for example, in he following manner.

After deposition of an interlevel insulating film 5a by CVD (Chemical Vapor Deposition), a posi-type photoresist film, for example, is formed thereover by coating. As illustrated in FIG. 25, patterns of the mask RM1 are transferred to a photoresist film on the wafer by projection exposure reduction treatment, as illustrated in FIG. 25, followed by a series of photolithography steps, such as development, whereby photoresist patterns are formed. Using these photoresist patterns as etching masks, the interlevel insulating film exposed therefrom is removed, whereby contact holes CNT are formed. In each of these contact holes CNT, a plug 16 is formed. The plug 16 is formed, for example, by depositing a titanium nitride (TIN) film and a tungsten (W) film by CVD over the interlevel insulating film 5a, including the inside of the contact hole CNT, removing unnecessary portions of the titanium nitride film and tungsten film over the interlevel insulating film 5a by etch back and leaving these films only in the contact holes CNT. Over the interlevel insulating film 5a, a first-level interconnect 17, which is made of, for example, tungsten, is formed. The first-level interconnect 17 is electrically connected with the semiconductor regions 14,15 for providing a source-drain of the nMISQn and PMISQP devices and gate etectrode 12 via the plug 16.

According to this Embodiment 1, the following advantages are available.

(1) An etching step for the formation of the light shielding film 3 from a metal film becomes unnecessary by constituting the phase shift film 2 and light shielding film 3 of the mask RM1 from a resist film. Production of a phase shift mask, which otherwise needs more steps, in number and complexity, than those for a normal mask can be simplified, making it possible to greatly shorten the manufacturing time of the mask RM1 having high resolution characteristics.

(2) An etching step necessary for the formation of the light shielding film 3 from a metal film becomes unnecessary by constituting the phase shift film 2 and light shielding film 3 of the mask RM1 from a resist film. Production of a phase shift mask which otherwise needs more steps, in number and complexity, than those for a normal mask, can be simplified, making it possible to greatly reduce the manufacturing cost of a mask RM1 having high resolution characteristics (3) An etching step necessary for the formation of the light shielding film 3 from a metal film becomes unnecessary by constituting the light shielding film 3 of the mask RM1 from a resist film. A size error due to etching can therefore be eliminated, whereby the pattern size accuracy of a mask RM1 having high resolution characteristics can be improved.

(4) A considerable reduction in the production time of the mask RM1 leads to a drastic decrease in the fabrication (including development and manufacture) time of a semiconductor integrated circuit device using it.

(5) A considerable reduction in the production cost of the mask RM1 leads to a drastic decrease in the cost of a semiconductor integrated circuit device fabricated using it (6) Owing to an improvement in the pattern size accuracy on the mask RM1, the size accuracy of the patterns to be transferred onto a wafer can be improved.

(7) The advantage as described in graph (6) brings about an improvement in the performance of a semiconductor integrated circuit device.

(8) By the advantage as described above in graph (6), miniaturization of a semiconductor integrated circuit device can be promoted.

(Embodiment 2)

In this Embodiment 2, a case is described in which a hole-pattern-dense region and a hole-pattern-sparse region exist in the same layer.

Figure 27:
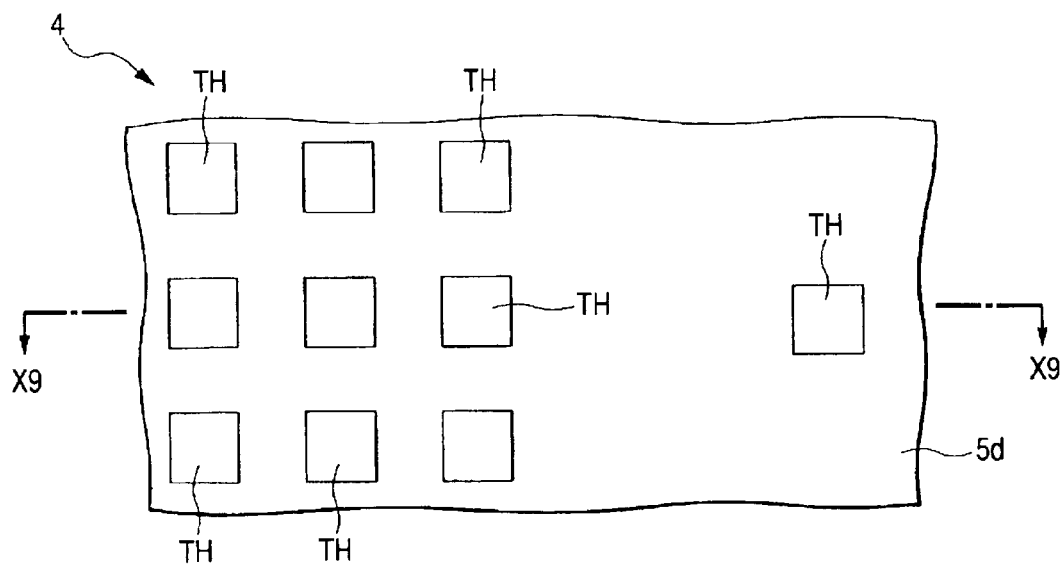
FIG. 27 is a fragmentary plan view of a semiconductor integrated circuit device according to another embodiment of the present invention.
Figure 28:
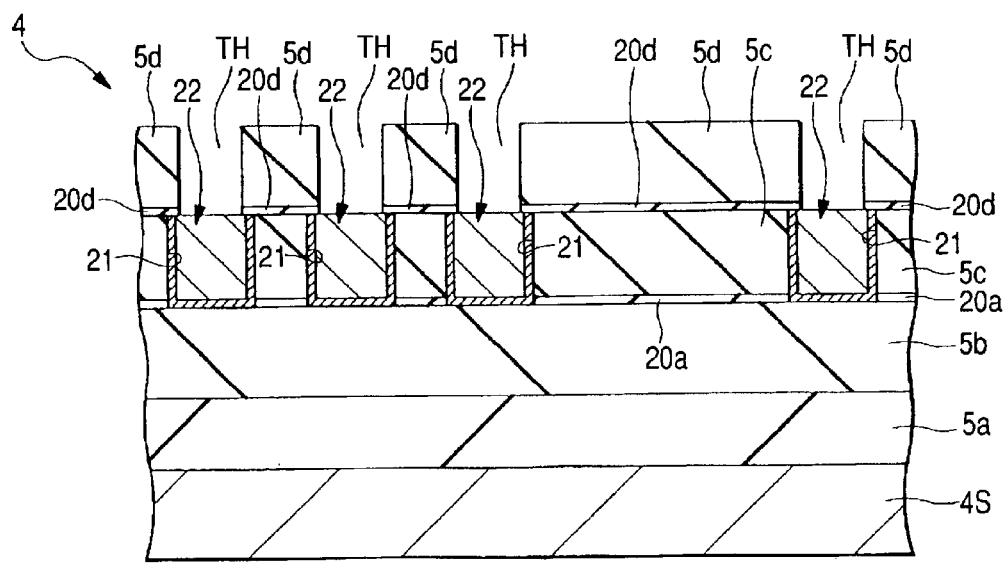
FIG. 28 is a cross-sectional view taken along a line X9—X9 of FIG. 27.

FIG. 27 is a fragmentary plan view of a semiconductor integrated circuit device having a logic circuit portion according to Embodiment 2; and FIG. 28 is a cross-sectional view taken along a line X9—X9 of FIG. 27. In FIG. 27, a through hole (hole pattern) THE is shown as having a planar square shape, but it is actually circular.

Over an interlevel insulating film 5a, an interlevel insulating film 5b made of, for example, silicon oxide is deposited. Over the interlevel insulating film 5b, an interlevel insulating film 5c made of, for example, silicon oxide is deposited via a thin insulating film 20a that is made of silicon nitride ($Si_3N_4$ or the like), which is about 5 nm thick. In the insulating film 20a and interlevel insulating film 5c, interconnect trenches 21 are formed. In these interconnect trenches 21, second-level inlaid interconnects 22 are formed. Each of the second inlaid interconnects 22 has a main conductor film that is made of, for example, copper (Cu) and a thin barrier conductive film made of titanium nitride (TiN), which is formed to encompass the circumference (bottom surface and side surfaces) of the main conductor film. Over the interlevel insulating film 5c, an interlevel insulating film 5d, which is made of, for example, silicon oxide, is deposited via a thin insulating film 20b, which is made of, for example, silicon nitride of about 5 nm thick. In the interlevel insulating film 5d and insulating film 20b, a plurality of through holes THE are formed. From the bottom of each of the through holes THE, a portion of the second-level inlaid interconnect 22 is exposed. The drawing suggests that there exist, in the same layer, a region in which through holes are disposed densely (a hole pattern dense region at the left side of FIG. 27 or FIG. 28) and a region in which through holes THE are disposed sparsely (a hole pattern sparse region at the right side of FIG. 27 or FIG. 28).

Figure 29:
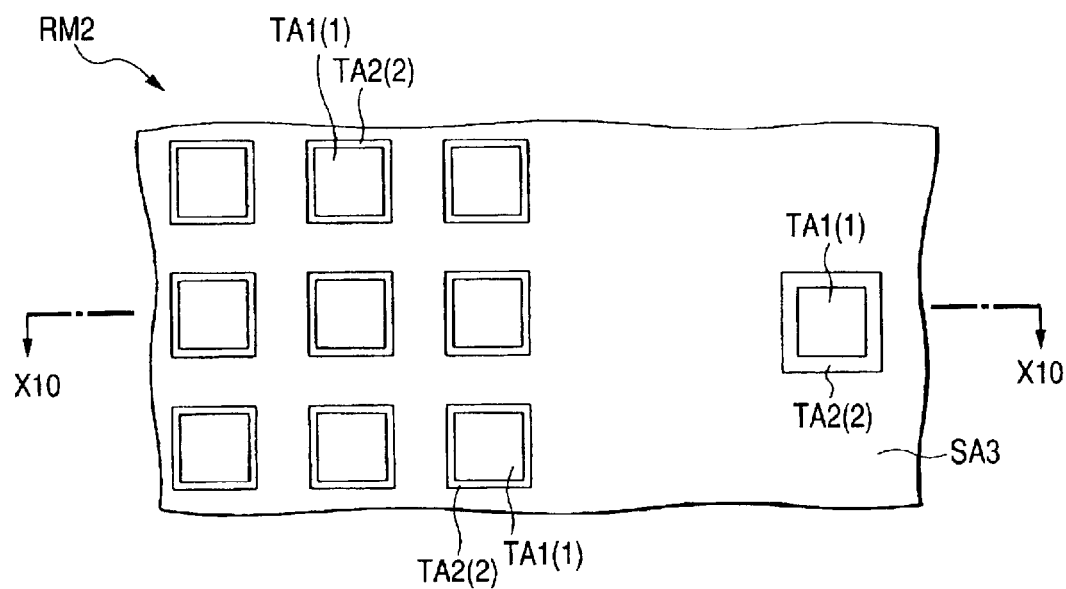
FIG. 29 is a fragmentary plan view of a phase shift mask to be used in the fabrication of the semiconductor integrated circuit device of FIG. 27 or FIG. 28.
Figure 30:
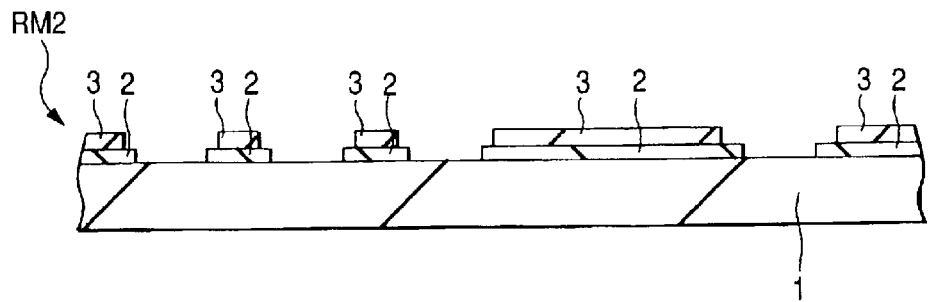
FIG. 30 is a cross-sectional view taken along a line X10—X10 of FIG. 29.

FIG. 29 is a fragmentary plan view of an edge-enhanced phase shift resist mask RM2 (which will hereinafter simply be called a "mask RM2") to be used for transfer of the patterns of a through hole THE, as illustrated in FIG. 27 and FIG. 28; and FIG. 30 is a cross-sectional view taken along a line X10—X10 of FIG. 29.

For example, in a semiconductor integrated circuit device having a logic circuit portion, a hole pattern dense region and a hole pattern sparse region usually exist in the same layer. Under the conditions when CT is as large as 0.6 to 0.7, an imbalance as described below sometimes occurs. In this regard, the side peak transfer margin is small in spite of the fact that the focus margin is large in the hole pattern dense region, while the side peak transfer margin is large in spite that the focus margin is small in the hole pattern sparse region.

In the edge enhanced phase shift resist mask, according to an investigation by the present inventors, there is a tendency that, when the edge region (corresponding to the second light transmitting region TA2) is widened, an increase in the focus margin, but a reduction in the side peak transfer margin, occur; while, when the edge region is narrowed, a reduction in the focus margin, but an increase in the side peak transfer margin, occur.

As illustrated in FIG. 29 and FIG. 30, the edge region (corresponding to the second light transmitting region TA2) is narrowed in the hole pattern dense region, while the edge region is widened in the hole pattern sparse region. This heightens the total focus margin, thereby making it possible to enlarge the total side peak transfer margin. Thus, by changing the width of the edge region, depending on how patterns are disposed, the process margin can be heightened.

In the above-described Embodiment 1 and the present Embodiment 2, the formation of hole patterns was described. What was described can be applied not only to the formation of hole patterns, but also to the formation of line patterns (for example, patterns for the above-d scribed first-level interconnect 17 or interconnect trench 21) or another complex pattern. In such a case, the process margin can be expanded by changing the edge region width according to the patterns.

The present invention so far have been described specifically based on various Embodiments. It is needless to say that the present invention is not limited to the above-described Embodiments, but can be changed to an extent not departing from the gist of the invention.

In the above-described Embodiments, as a semiconductor integrated circuit substrate, use of a semiconductor substrate made of a single semiconductor was described, but the semiconductor integrated circuit substrate is not limited thereto. Rather, an SOI (Silicon On Insulator) substrate having a thin semiconductor layer disposed over an insulating layer or an epitaxial substrate having an epitaxial layer formed over a semiconductor substrate may be used.

In the above-described embodiments, KrF was used as the main exposure light, but also i line (wavelength: 365 nm), ArF (wavelength: 193 nm) or $F_2$ (wavelength: 157 nm) can be used as the exposure light The foregoing description of the present invention was directed to a method of fabrication of a semiconductor integrated circuit device having a CMIS circuit for which the invention has been completed. The present invention can be applied not only to the above-described method, but also to a method of fabrication of a semiconductor integrated circuit device having a memory circuit, such as DRAM (Dynamic Random Access Memory), SRAM (Static Random Access Memory) or a flash memory (EEPROM; Electric Erasable Programmable Read Only Memory), a method of fabrication of a semiconductor integrated circuit device having a logic circuit such as micro processor unit, and a method of fabrication of an embedded type semiconductor integrated circuit d vice having both a memory circuit and a logic circuit on the same semiconductor substrate. The present invention is also effective when applied to the production of a superconductive apparatus, micromachine, magnetic head, electronic device and liquid-crystal panel.

Advantages available from the representative aspects of the invention, among the features disclosed by the present application, will be described briefly.

(1) It becomes possible to shorten the manufacturing time of an edge-enhanced phase shift mask by constituting only a light shielding body of an edge-enhanced phase shift mask or both of the shielding body and a phase shifter from a resist film.

(2) It becomes possible to shorten the production time of a semiconductor integrated circuit device using an edge-enhanced phase shift mask, by employing an exposure step for transferring a predetermined pattern to a photosensitive resin film on a wafer through an edge-enhanced phase shift mask having only a light shielding body or both of the light shielding body and a phase shifter constituted from a resist film.

What is claimed is:

1. A fabrication method of a semiconductor integrated circuit device, comprising the steps of:

preparing a mask having, on a first main surface of a mask substrate, a first light transmitting region, a second light transmitting region disposed at the periphery of the first light transmitting region and permitting inversion of the phase of a light transmitted through the second light transmitting region relative to a light transmitted through the first light transmitting region, and a light shielding region disposed at the periphery of the second light transmitting region; and transferring predetermined patterns to a photoresist film over the main surface of a wafer by projection exposure reduction treatment using the mask, wherein said second light transmitting region has a first film formed over the first main surface of the mask substrate, wherein said light shielding region has a second film formed over the first main surface of the mask substrate via said first film, and wherein at least one of said first film and second film is a resist film.

2. A method according to claim 1, wherein said predetermined patterns are each a hole pattern or a line pattern.

3. A method according to claim 1, wherein an exposure light used upon said projection exposure reduction treatment is KrF having a wavelength of 248 nm.

4. A method according to claim 1, wherein the transmittance of the exposure light through said second light transmitting region is an intermediate value between that through said first light transmitting region and that through said light shielding region.

5. A method according to claim 1, wherein the transmittance of the exposure light through said second light transmitting region ranges from 3% to 100%.

6. A method according to claim 1, wherein the transmittance of the exposure light through said second light transmitting region ranges from 20% to 90%.

7. A method according to claim 1, wherein the transmittance of the exposure light through said second light transmitting region ranges from 50% to 90%.

8. A method according to claim 1, wherein in said mask, said second light transmitting region has a width made smaller in a densely-disposed region of said predetermined patterns than in a sparsely-disposed region of said predetermined patterns.

9. A fabrication method of a semiconductor integrated circuit device, comprising the steps of:

preparing a mask having, on a first main surface of a mask substrate, a first light transmitting region, a second light transmitting region disposed at the periphery of the first light transmitting region and permitting inversion of the phase of a light transmitted through the second light transmitting region relative to a light transmitted through the first light transmitting region, and a light shielding region disposed at the periphery of the second light transmitting region; and transferring predetermined patterns to a photoresist film over the main surface of a wafer by projection exposure reduction treatment using said mask, wherein said second light transmitting region has a first film formed over the first main surface of the mask substrate, wherein said light shielding region has a second film formed over the first main surface of the mask substrate via said first film, wherein said first film is a photosensitive SOG film, and wherein said second film is a resist film.

10. A method according to claim 9, wherein said predetermined patterns are each a hole pattern or a line pattern.

11. A method according to claim 9, wherein an exposure light used upon said projection exposure reduction treatment is KrF having a wavelength of 248 nm.

12. A method according to claim 9, wherein the transmittance of the exposure light through said second light transmitting region is an intermediate value between that through said first light transmitting region and that through said light shielding region.

13. A method according to claim 9, wherein the transmittance of the exposure light through said second light transmitting region ranges from 3% to 100%.

14. A method according to claim 9, wherein the transmittance of the exposure light through said second light transmitting region ranges from 20% to 90%.

15. A method according to claim 9, wherein the transmittance of the exposure light through said second light transmitting region ranges from 50% to 90%.

16. A method according to claim 9, wherein in said mask, said second light transmitting region has a width made smaller in a densely-disposed region of said predetermined patterns than in a sparsely-disposed region of said predetermined patterns.

17. A fabrication method of a semiconductor integrated circuit device, comprising the steps of:

preparing a mask having, on a first main surface of a mask substrate, a first light transmitting region, a second light transmitting region disposed at the periphery of the first light transmitting region and permitting inversion of the phase of a light transmitted through the second light transmitting region relative to a light transmitted through the first light transmitting region, and a light shielding region disposed at the periphery of the second light transmitting region; and transferring predetermined patterns to a photoresist film over the main surface of a wafer by projection exposure reduction treatment using said mask, wherein said second light transmitting region has a first film formed over the first main surface of the mask substrate, wherein said light shielding region has a second film formed over the first main surface of the mask substrate via said first film, and wherein each of said first film and said second film is a resist film.

18. A method according to claim 17, wherein said predetermined patterns are each a hole pattern or a line pattern.

19. A method according to claim 17, wherein an exposure light used upon said projection exposure reduction treatment is KrF having a wavelength of 248 nm.

20. A method according to claim 17, wherein the transmittance of the exposure light through said second light transmitting region is an intermediate value between that through said first light transmitting region and that through said light shielding region.

21. A method according to claim 17, wherein the transmittance of the exposure light through said second light transmitting region ranges from 3% to 100%.

22. A method according to claim 17, wherein the transmittance of the exposure light through said second light transmitting region ranges from 20% to 90%.

23. A method according to claim 17, wherein the transmittance of the exposure light through said second light transmitting region ranges from 50% to 90%.

24. A method according to claim 17, wherein in said mask, said second light transmitting region has a width made smaller in a densely-disposed region of said predetermined patterns than in a sparsely-disposed region of said predetermined patterns.

25. A mask comprising, on a first main surface of a mask substrate, a first light transmitting region, a second light transmitting region disposed at the periphery of the first light transmitting region and permitting inversion of the phase of a light transmitted through the second light transmitting region relative to a light transmitted through the first light transmitting region, and a light shielding region disposed at the periphery of the second light transmitting region, wherein said second light transmitting region has a first film formed over the first main surface of the mask substrate, wherein said light shielding region has a second film formed over the first main surface of the mask substrate via said first film, and wherein at least one of said first film and said second film is resist film.

26. A mask according to claim 25, wherein the transmittance of the exposure light through said second light transmitting region is an intermediate value between that through said first light transmitting region and that through said light shielding region.

27. A mask according to claim 25, wherein the transmittance of the exposure light through said second light transmitting region is equal to or lower than that through said first light transmitting region.

28. A mask according to claim 25, wherein the transmittance of the exposure light through said second light transmitting region ranges from 3% to 100%.

29. A mask according to claim 25, wherein the transmittance of the exposure light through said second light transmitting region ranges from 20% to 90%.

30. A mask according to claim 25, wherein the transmittance of the exposure light through said second light transmitting region ranges from 50% to 90%.

31. A mask according to claim 25, wherein in said mask, said second light transmitting region has a width made smaller in a densely-disposed region of said predetermined patterns than in a sparsely-disposed region of said predetermined patterns.

32. A mask comprising, on a first main surface of a mask substrate, a first light transmitting region, a second light transmitting region disposed at the periphery of the first light transmitting region and permitting inversion of the phase of a light transmitted through the second light transmitting region relative to a light transmitted through the first light transmitting region, and a light shielding region disposed at the periphery of the second light transmitting region, wherein said second light transmitting region has a first film formed over the first main surface of the mask substrate, wherein said light shielding region has a second film formed over the first main surface of the mask substrate via said first film, wherein said first film is a photosensitive SOG film, and wherein said second film is a resist film.

33. A mask according to claim 32, wherein the transmittance of the exposure light through said second light transmitting region is an intermediate value between that through said first light transmitting region and that through said light shielding region.

34. A mask according to claim 32, wherein the transmittance of the exposure light through said second light transmitting region is equal to or lower than that through said first light transmitting region.

35. A mask according to claim 32, wherein the transmittance of the exposure light through said second light transmitting region ranges from 3% to 100%.

36. A mask according to claim 32, wherein the transmittance of the exposure light through said second light transmitting region ranges from 20% to 90%.

37. A mask according to claim 32, wherein the transmittance of the exposure light through said second light transmitting region ranges from 50% to 90%.

38. A mask according to claim 32, wherein in said mask, said second light transmitting region has a width made smaller in a densely-disposed region of said predetermined patterns than in a sparsely-disposed region of said predetermined patterns.

39. A mask comprising, on a first main surface of a mask substrate, a first light transmitting region, a second light transmitting region disposed at the periphery of the first light transmitting region and permitting inversion of the phase of a light transmitted through the second light transmitting region relative to a light transmitted through the first light transmitting region, and a light shielding region disposed at the periphery of the second light transmitting region, wherein said second light transmitting region has a first film formed over the first main surface of the mask substrate, wherein said light shielding region has second film formed over the first main surface of the mask substrate via said first film, and wherein each of said first film and said second film is a resist film.

40. A mask according to claim 39, wherein the transmittance of the exposure light through said second light transmitting region is an intermediate value between that through said first light transmitting region and that through said light shielding region.

41. A method according to claim 1, wherein said second film is a resist film.

42. A method according to claim 1, wherein said resist film is a film of a resist including a base resin.

43. A method according to claim 9, wherein said resist film is a film of a resist including a base resin.

44. A method according to claim 17, wherein said resist film is a film of a resist including a base resin.

45. A mask according to claim 25, wherein said second film is a resist film.

46. A mask according to claim 25, wherein said resist film is a film of a resist including a base resin.

47. A mask according to claim 32, wherein said resist film is a film of a resist including a base resin.

48. A mask according to claim 39, wherein said resist film is a film of a resist including a base resin.

* * * * *